(12) United States Patent
Schroeder

(10) Patent No.: US 10,557,649 B2
(45) Date of Patent: Feb. 11, 2020

(54) VARIABLE TEMPERATURE MAGNETO-CALORIC THERMAL DIODE ASSEMBLY

(71) Applicant: Haier US Appliance Solutions, Inc., Wilmington, DE (US)

(72) Inventor: Michael Goodman Schroeder, Louisville, KY (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 74 days.

(21) Appl. No.: 15/955,843

(22) Filed: Apr. 18, 2018

(65) Prior Publication Data

US 2019/0323745 A1  Oct. 24, 2019

(51) Int. Cl.
| | |
|---|---|
| *F25B 21/00* | (2006.01) |
| *H01F 1/01* | (2006.01) |
| *F25D 11/02* | (2006.01) |
| *H01L 37/04* | (2006.01) |
| *F28D 15/02* | (2006.01) |

(52) U.S. Cl.
CPC ............. *F25B 21/00* (2013.01); *F25D 11/02* (2013.01); *F28D 15/0275* (2013.01); *H01F 1/012* (2013.01); *H01L 37/04* (2013.01); *F25B 2321/0022* (2013.01)

(58) Field of Classification Search
CPC ............. F25B 21/00; F25B 2321/0022; F25B 2321/002; F25B 2321/001; H01F 1/012; H01F 1/015; H01F 1/017
See application file for complete search history.

(56) References Cited

U.S. PATENT DOCUMENTS

| | | |
|---|---|---|
| 668,560 A | 2/1901 | Fulner et al. |
| 1,985,455 A | 12/1934 | Mosby |
| 2,671,929 A | 3/1954 | Gayler |

(Continued)

FOREIGN PATENT DOCUMENTS

| | | |
|---|---|---|
| CA | 2893874 A1 | 6/2014 |
| CA | 2919117 A1 | 1/2015 |

(Continued)

OTHER PUBLICATIONS

International Search Report issued in connection with PCT Application No. PCT/US2014/042485 dated Oct. 23, 2014.

(Continued)

*Primary Examiner* — Frantz F Jules
*Assistant Examiner* — Erik Mendoza-Wilkenfel
(74) *Attorney, Agent, or Firm* — Dority & Manning, P.A.

(57) ABSTRACT

A magneto-caloric thermal diode assembly includes a magneto-caloric cylinder with a plurality of magneto-caloric stages. Each of the plurality of magneto-caloric stages has a respective Currie temperature. The magneto-caloric cylinder has a length along an axial direction. The plurality of magneto-caloric stages is distributed along the length of the magneto-caloric cylinder. A plurality of thermal stages also has a length along the axial direction. The length of the plurality of thermal stages is less than the length of the magneto-caloric cylinder. The magneto-caloric cylinder is received within the plurality of thermal stages such that the magneto-caloric cylinder is movable along the axial direction relative to the plurality of thermal stages.

19 Claims, 9 Drawing Sheets

(56) References Cited

U.S. PATENT DOCUMENTS

| | | | |
|---|---|---|---|
| 2,765,633 A | 10/1956 | Muffly | |
| 3,618,265 A | 11/1971 | Croop | |
| 3,816,029 A | 6/1974 | Bowen et al. | |
| 3,956,076 A | 5/1976 | Powell, Jr. et al. | |
| 4,037,427 A | 7/1977 | Kramer | |
| 4,102,655 A | 7/1978 | Jeffery et al. | |
| 4,107,935 A | 8/1978 | Steyert, Jr. | |
| 4,197,709 A | 4/1980 | Hochstein | |
| 4,200,680 A | 4/1980 | Sasazawa et al. | |
| 4,259,843 A | 4/1981 | Kausch | |
| 4,332,135 A * | 6/1982 | Barclay | F25B 21/00 505/889 |
| 4,507,927 A | 4/1985 | Barclay | |
| 4,507,928 A | 4/1985 | Nasa | |
| 4,549,155 A | 10/1985 | Halbach | |
| 4,554,790 A | 11/1985 | Toshiba | |
| 4,557,228 A | 12/1985 | Samodovitz | |
| 4,599,866 A | 7/1986 | Nakagome et al. | |
| 4,625,519 A | 12/1986 | Hakuraku et al. | |
| 4,642,994 A | 2/1987 | Barclay et al. | |
| 4,735,062 A | 4/1988 | Woolley et al. | |
| 4,741,175 A | 5/1988 | Schulze | |
| 4,785,636 A | 11/1988 | Hakuraku et al. | |
| 4,796,430 A | 1/1989 | Malaker et al. | |
| 5,091,361 A | 2/1992 | Hed | |
| 5,156,003 A | 10/1992 | Yoshiro et al. | |
| 5,190,447 A | 3/1993 | Schneider | |
| 5,249,424 A | 10/1993 | DeGregoria et al. | |
| 5,336,421 A | 8/1994 | Kurita et al. | |
| 5,351,791 A | 10/1994 | Rosenzweig | |
| 5,465,781 A | 11/1995 | DeGregoria | |
| 5,599,177 A | 2/1997 | Hetherington | |
| 5,661,895 A | 9/1997 | Irgens | |
| 5,718,570 A | 2/1998 | Beckett et al. | |
| 5,934,078 A | 8/1999 | Lawton, Jr. et al. | |
| 6,332,323 B1 | 12/2001 | Reid et al. | |
| 6,423,255 B1 | 7/2002 | Hoechsmann et al. | |
| 6,446,441 B1 | 9/2002 | Dean | |
| 6,467,274 B2 | 10/2002 | Barclay et al. | |
| 6,526,759 B2 | 3/2003 | Zimm et al. | |
| 6,588,215 B1 | 7/2003 | Ghoshal | |
| 6,612,816 B1 | 9/2003 | Vanden Brande et al. | |
| 6,668,560 B2 | 12/2003 | Zimm et al. | |
| 6,826,915 B2 | 12/2004 | Wada et al. | |
| 6,840,302 B1 | 1/2005 | Tanaka et al. | |
| 6,915,647 B2 | 7/2005 | Tsuchikawa et al. | |
| 6,935,121 B2 | 8/2005 | Fang et al. | |
| 6,946,941 B2 | 9/2005 | Chell | |
| 6,971,245 B2 | 12/2005 | Kuroyanagi | |
| 7,148,777 B2 | 12/2006 | Chell et al. | |
| 7,297,270 B2 | 11/2007 | Bernard et al. | |
| 7,313,926 B2 | 1/2008 | Gurin | |
| 7,481,064 B2 | 1/2009 | Kitanovski et al. | |
| 7,552,592 B2 | 6/2009 | Iwasaki et al. | |
| 7,644,588 B2 | 1/2010 | Shin et al. | |
| 7,863,789 B2 | 1/2011 | Zepp et al. | |
| 7,897,898 B2 | 3/2011 | Muller et al. | |
| 7,938,632 B2 | 5/2011 | Smith | |
| 8,061,147 B2 | 11/2011 | Dinesen et al. | |
| 8,069,662 B1 | 12/2011 | Albert | |
| 8,099,964 B2 | 1/2012 | Saito et al. | |
| 8,174,245 B2 | 5/2012 | Carver | |
| 8,191,375 B2 | 6/2012 | Sari et al. | |
| 8,209,988 B2 | 7/2012 | Zhang et al. | |
| 8,216,396 B2 | 7/2012 | Dooley et al. | |
| 8,310,325 B2 | 11/2012 | Zhang et al. | |
| 8,375,727 B2 | 2/2013 | Sohn | |
| 8,378,769 B2 | 2/2013 | Heitzler et al. | |
| 8,448,453 B2 | 5/2013 | Bahl et al. | |
| 8,551,210 B2 | 10/2013 | Reppel et al. | |
| 8,596,084 B2 | 12/2013 | Herrera et al. | |
| 8,616,009 B2 | 12/2013 | Dinesen et al. | |
| 8,656,725 B2 | 2/2014 | Muller et al. | |
| 8,695,354 B2 | 4/2014 | Heitzler et al. | |
| 8,729,718 B2 | 5/2014 | Kuo et al. | |
| 8,763,407 B2 | 7/2014 | Carroll et al. | |
| 8,769,966 B2 | 7/2014 | Heitzler et al. | |
| 8,869,541 B2 | 10/2014 | Heitzler et al. | |
| 8,904,806 B2 | 12/2014 | Cramet et al. | |
| 8,935,927 B2 | 1/2015 | Kobayashi et al. | |
| 8,978,391 B2 | 3/2015 | Muller et al. | |
| 9,175,885 B2 | 11/2015 | Katter | |
| 9,245,673 B2 | 1/2016 | Carroll et al. | |
| 9,377,221 B2 | 6/2016 | Benedict | |
| 9,400,126 B2 | 7/2016 | Takahashi et al. | |
| 9,523,519 B2 | 12/2016 | Muller | |
| 9,534,817 B2 | 1/2017 | Benedict et al. | |
| 9,548,151 B2 | 1/2017 | Muller | |
| 9,599,374 B2 | 3/2017 | Takahashi et al. | |
| 9,631,843 B2 | 4/2017 | Benedict | |
| 9,702,594 B2 | 7/2017 | Vetrovec | |
| 9,739,510 B2 | 8/2017 | Hassen | |
| 9,797,630 B2 | 10/2017 | Benedict et al. | |
| 9,810,454 B2 | 11/2017 | Tasaki et al. | |
| 9,857,105 B1 | 1/2018 | Schroeder et al. | |
| 9,857,106 B1 | 1/2018 | Schroeder et al. | |
| 9,927,155 B2 | 3/2018 | Boeder et al. | |
| 9,978,487 B2 | 5/2018 | Katter et al. | |
| 10,006,675 B2 | 6/2018 | Benedict et al. | |
| 10,018,385 B2 | 7/2018 | Radermacher et al. | |
| 2002/0040583 A1 | 4/2002 | Barclay et al. | |
| 2002/0066368 A1 | 6/2002 | Zornes | |
| 2002/0087120 A1 | 7/2002 | Rogers et al. | |
| 2003/0010054 A1 | 1/2003 | Esch et al. | |
| 2003/0051774 A1 | 3/2003 | Saito | |
| 2004/0093877 A1 | 5/2004 | Wada | |
| 2004/0182086 A1 | 9/2004 | Chiang et al. | |
| 2004/0187510 A1 | 9/2004 | Jung | |
| 2004/0187803 A1 | 9/2004 | Regev | |
| 2004/0250550 A1 | 12/2004 | Bruck | |
| 2005/0017394 A1 | 1/2005 | Hochsmann et al. | |
| 2005/0109490 A1 | 5/2005 | Harmon et al. | |
| 2005/0274676 A1 | 12/2005 | Kumar et al. | |
| 2006/0130518 A1 | 6/2006 | Kang et al. | |
| 2006/0231163 A1 | 10/2006 | Hirosawa et al. | |
| 2007/0130960 A1 | 6/2007 | Muller et al. | |
| 2007/0220901 A1 | 9/2007 | Kobayashi | |
| 2008/0223853 A1 | 9/2008 | Muller et al. | |
| 2008/0236171 A1 | 10/2008 | Saito et al. | |
| 2008/0236175 A1 | 10/2008 | Chaparro Monferrer et al. | |
| 2008/0303375 A1 | 12/2008 | Carver | |
| 2009/0091411 A1 | 4/2009 | Zhang et al. | |
| 2009/0158749 A1 | 6/2009 | Sandeman | |
| 2009/0217674 A1 | 9/2009 | Kaji et al. | |
| 2009/0236930 A1 | 9/2009 | Nashiki | |
| 2009/0266083 A1 | 10/2009 | Shin et al. | |
| 2009/0308080 A1 | 12/2009 | Han et al. | |
| 2009/0320499 A1 * | 12/2009 | Muller | F25B 21/00 62/3.1 |
| 2010/0000228 A1 | 1/2010 | Wiest et al. | |
| 2010/0058775 A1 | 3/2010 | Kaji et al. | |
| 2010/0071383 A1 | 3/2010 | Zhang et al. | |
| 2010/0116471 A1 | 5/2010 | Reppel | |
| 2010/0122488 A1 | 5/2010 | Fukai | |
| 2010/0150747 A1 | 6/2010 | Mehta et al. | |
| 2010/0162747 A1 | 7/2010 | Hamel et al. | |
| 2010/0209084 A1 | 8/2010 | Nelson et al. | |
| 2010/0236258 A1 | 9/2010 | Heitzler et al. | |
| 2010/0276627 A1 | 11/2010 | Mazet | |
| 2010/0303917 A1 | 12/2010 | Watson et al. | |
| 2011/0000206 A1 | 1/2011 | Aprad | |
| 2011/0042608 A1 | 2/2011 | Reesink | |
| 2011/0048031 A1 | 3/2011 | Barve | |
| 2011/0048690 A1 | 3/2011 | Reppel et al. | |
| 2011/0058795 A1 | 3/2011 | Kleman et al. | |
| 2011/0061398 A1 | 3/2011 | Shih et al. | |
| 2011/0062821 A1 | 3/2011 | Chang et al. | |
| 2011/0082026 A1 | 4/2011 | Sakatani et al. | |
| 2011/0094243 A1 | 4/2011 | Carroll et al. | |
| 2011/0162388 A1 | 7/2011 | Barve et al. | |
| 2011/0168363 A9 | 7/2011 | Reppel et al. | |
| 2011/0173993 A1 | 7/2011 | Muller et al. | |
| 2011/0182086 A1 | 7/2011 | Mienko et al. | |
| 2011/0192836 A1 | 8/2011 | Muller et al. | |

(56) References Cited

U.S. PATENT DOCUMENTS

| | | |
|---|---|---|
| 2011/0218921 A1 | 9/2011 | Addala et al. |
| 2011/0239662 A1 | 10/2011 | Bahl et al. |
| 2011/0284196 A1 | 11/2011 | Zanadi |
| 2011/0302931 A1 | 12/2011 | Sohn |
| 2011/0308258 A1 | 12/2011 | Smith et al. |
| 2011/0314836 A1 | 12/2011 | Heitzler et al. |
| 2012/0031108 A1 | 2/2012 | Kobayashi et al. |
| 2012/0033002 A1 | 2/2012 | Seeler et al. |
| 2012/0036868 A1 | 2/2012 | Heitzler et al. |
| 2012/0045698 A1 | 2/2012 | Shima |
| 2012/0060526 A1 | 3/2012 | May et al. |
| 2012/0079834 A1 | 4/2012 | Dinesen |
| 2012/0222427 A1 | 9/2012 | Hassen |
| 2012/0222428 A1 | 9/2012 | Celik et al. |
| 2012/0266591 A1 | 10/2012 | Morimoto et al. |
| 2012/0266607 A1 | 10/2012 | Morimoto et al. |
| 2012/0267090 A1 | 10/2012 | Kruglick |
| 2012/0272665 A1 | 11/2012 | Watanabe et al. |
| 2012/0272666 A1 | 11/2012 | Watanabe |
| 2012/0285179 A1 | 11/2012 | Morimoto |
| 2012/0291453 A1 | 11/2012 | Watanabe et al. |
| 2013/0019610 A1 | 1/2013 | Zimm et al. |
| 2013/0020529 A1 | 1/2013 | Chang et al. |
| 2013/0104568 A1 | 5/2013 | Kuo et al. |
| 2013/0106116 A1 | 5/2013 | Kuo et al. |
| 2013/0145573 A1 | 6/2013 | Bizhanzadeh |
| 2013/0180263 A1 | 7/2013 | Choi et al. |
| 2013/0186107 A1 | 7/2013 | Shih et al. |
| 2013/0187077 A1 | 7/2013 | Katter |
| 2013/0192269 A1 | 8/2013 | Wang |
| 2013/0199460 A1 | 8/2013 | Duplessis et al. |
| 2013/0227965 A1 | 9/2013 | Yagi et al. |
| 2013/0232993 A1 | 9/2013 | Saito et al. |
| 2013/0255279 A1 | 10/2013 | Tomimatsu et al. |
| 2013/0269367 A1 | 10/2013 | Meillan |
| 2013/0298571 A1 | 11/2013 | Morimoto et al. |
| 2013/0300243 A1 | 11/2013 | Gieras et al. |
| 2013/0319012 A1 | 12/2013 | Kuo et al. |
| 2013/0327062 A1 | 12/2013 | Watanabe et al. |
| 2014/0020881 A1 | 1/2014 | Reppel et al. |
| 2014/0075958 A1 | 3/2014 | Takahashi et al. |
| 2014/0116538 A1 | 5/2014 | Tanaka et al. |
| 2014/0165594 A1 | 6/2014 | Benedict |
| 2014/0165595 A1 | 6/2014 | Zimm et al. |
| 2014/0190182 A1 | 7/2014 | Benedict |
| 2014/0216057 A1 | 8/2014 | Oezcan |
| 2014/0260373 A1 | 9/2014 | Gerber et al. |
| 2014/0290273 A1 | 10/2014 | Benedict et al. |
| 2014/0290275 A1 | 10/2014 | Muller |
| 2014/0291570 A1 | 10/2014 | Klausner et al. |
| 2014/0305137 A1 | 10/2014 | Benedict |
| 2014/0305139 A1 | 10/2014 | Takahashi et al. |
| 2014/0325996 A1 | 11/2014 | Muller |
| 2014/0366557 A1 | 12/2014 | Mun et al. |
| 2015/0007582 A1 | 1/2015 | Kim et al. |
| 2015/0027133 A1 | 1/2015 | Benedict |
| 2015/0030483 A1 | 1/2015 | Ryu |
| 2015/0033762 A1 | 2/2015 | Cheng et al. |
| 2015/0033763 A1 | 2/2015 | Saito et al. |
| 2015/0047371 A1 | 2/2015 | Hu et al. |
| 2015/0068219 A1 | 3/2015 | Komorowski et al. |
| 2015/0089960 A1 | 4/2015 | Takahashi et al. |
| 2015/0114007 A1 | 4/2015 | Neilson et al. |
| 2015/0168030 A1 | 6/2015 | Leonard et al. |
| 2015/0211440 A1 | 7/2015 | Joffroy |
| 2015/0260433 A1 | 9/2015 | Choi et al. |
| 2015/0267943 A1 | 9/2015 | Kim et al. |
| 2015/0362225 A1 | 12/2015 | Schwartz |
| 2015/0369524 A1 | 12/2015 | Ikegami et al. |
| 2016/0000999 A1 | 1/2016 | Focht et al. |
| 2016/0032920 A1 | 2/2016 | Hatami Aghdam |
| 2016/0084544 A1 | 3/2016 | Radermacher et al. |
| 2016/0091227 A1 | 3/2016 | Leonard et al. |
| 2016/0146515 A1* | 5/2016 | Momen ................. F25B 21/00 62/3.1 |
| 2016/0216012 A1 | 7/2016 | Benedict et al. |
| 2016/0238287 A1 | 8/2016 | Benedict |
| 2016/0273811 A1 | 9/2016 | Smith et al. |
| 2016/0282021 A1 | 9/2016 | Zhao et al. |
| 2016/0298880 A1 | 10/2016 | Humburg |
| 2016/0355898 A1 | 12/2016 | Vieyra Villegas et al. |
| 2016/0356529 A1 | 12/2016 | Humburg |
| 2016/0367982 A1 | 12/2016 | Pennie |
| 2017/0059213 A1 | 3/2017 | Barclay et al. |
| 2017/0071234 A1 | 3/2017 | Garg |
| 2017/0138648 A1 | 5/2017 | Cui |
| 2017/0176083 A1 | 6/2017 | Sul et al. |
| 2017/0328603 A1 | 11/2017 | Barclay et al. |
| 2017/0328649 A1 | 11/2017 | Brandmeier |
| 2017/0370624 A1 | 12/2017 | Zimm et al. |
| 2018/0005735 A1 | 1/2018 | Scharf et al. |
| 2018/0023852 A1 | 1/2018 | Schroeder et al. |
| 2018/0195775 A1 | 7/2018 | Schroeder et al. |
| 2018/0283740 A1 | 10/2018 | Holladay et al. |

FOREIGN PATENT DOCUMENTS

| | | | |
|---|---|---|---|
| CN | 101979937 A | 2/2011 | |
| CN | 201772566 U | 3/2011 | |
| CN | 101788207 B | 9/2011 | |
| CN | 202432596 U | 9/2012 | |
| CN | 103090583 A | 5/2013 | |
| CN | 103712401 A | 4/2014 | |
| CN | 102077303 B | 4/2015 | |
| CN | 106481842 A | 3/2017 | |
| DE | 102013223959 A1 | 5/2015 | |
| DE | 202015106851 U1 | 3/2016 | |
| EP | 0187078 A1 | 7/1986 | |
| EP | 2071255 A1 | 6/2009 | |
| EP | 2108904 A1 | 10/2009 | |
| EP | 2215955 A1 | 8/2010 | |
| EP | 2322072 A2 | 5/2011 | |
| EP | 2420760 A1 | 2/2012 | |
| EP | 3306082 A2 | 4/2018 | |
| FR | 2935468 A1 | 3/2010 | |
| JP | 59232922 A | 12/1984 | |
| JP | H08166182 A | 6/1996 | |
| JP | 3205196 B2 | 9/2001 | |
| JP | 2002315243 A | 10/2002 | |
| JP | 2007147136 A | 6/2007 | |
| JP | 2007291437 A | 11/2007 | |
| JP | 2008051412 A | 3/2008 | |
| JP | 2010112606 A | 5/2010 | |
| JP | 2010525291 A | 7/2010 | |
| JP | 6212955 B2 | 12/2014 | |
| JP | 2014228216 A | 12/2014 | |
| JP | 5907023 B2 | 4/2016 | |
| JP | 6079498 B2 | 2/2017 | |
| JP | 6191539 B2 | 9/2017 | |
| JP | 2017207222 A | 11/2017 | |
| KR | 101100301 B1 | 12/2011 | |
| KR | 101238234 B1 | 3/2013 | |
| WO | WO0212800 A1 | 2/2002 | |
| WO | WO-03016794 A1 * | 2/2003 | ............. F25B 21/00 |
| WO | WO03016794 A1 | 2/2003 | |
| WO | WO2004/068512 A1 | 8/2004 | |
| WO | WO2007/036729 A1 | 4/2007 | |
| WO | WO2009/024412 A1 | 2/2009 | |
| WO | WO2010/119591 A1 | 10/2010 | |
| WO | WO2011034594 A1 | 3/2011 | |
| WO | WO2014099199 A1 | 6/2014 | |
| WO | WO2014170447 A1 | 10/2014 | |
| WO | WO2014173787 A1 | 10/2014 | |
| WO | WO2015017230 A1 | 2/2015 | |
| WO | WO2016035267 A1 | 3/2016 | |
| WO | WO2017042266 A1 | 3/2017 | |
| WO | WO2017097989 A1 | 6/2017 | |

OTHER PUBLICATIONS

International Search Report issued in connection with PCT Application No. PCT/US2014/017431 dated May 9, 2014.

(56) References Cited

OTHER PUBLICATIONS

International search report issued in connection with PCT/US2013/070518, dated Jan. 22, 2014.
Tetsuji Okamura, Performance of a room-temperature rotary magnet refrigerator, dated Nov. 28, 2005, Elsevier.
Journal of Alloys and Compounds, copyright 2008 Elsevier B . . . V.
Evaluation of Ni—Mn—In—Si Alloys for Magnetic Refrigerant Application, Rahul Das, A. Perumal and A. Srinivasan, Dept of Physics, Indian Institute of Technology, Oct. 10, 2011.
Effects of annealing on the magnetic entropy change and exchange bias behavior in melt-spun Ni—Mn—In ribbons, X.Z. Zhao, C.C. Hsieh, et al Science Direct, Scripta Materialia 63 (2010).
PCT International Search Report and Written Opinion issued in connection with PCT Application No. PCT/US2013/070023 dated Feb. 27, 2014.
Barbara Pulko, Epoxy-bonded La—Fe—Co—Si magnetocaloric plates, Journal of Magnetism and Magnetic Materials, 375 (2015) 65-73.
International Search Report of PCT/US2014/047925 dated Nov. 10, 2014.
Andrej Kitanovski, Present and future caloric refrigeration and heat-pump technologies, International Journal of Refrigeration, vol. 57, Sep. 2015, pp. 288-298.
C Aprea, et al., An innovative rotary permanent magnet magnetic refrigerator based on AMR cycle, Thermal Energy Systems: Production, Storage, Utilization and the Environment, dated May 2015, Napoli, Italy, pp. 1-5.
Stefano Dall'Olio, et al., Numerical Simulation of a Tapered Bed AMR, Technical University of Denmark, 2015, 2 pages.

* cited by examiner

VARIABLE TEMPERATURE MAGNETO-CALORIC THERMAL DIODE ASSEMBLY

FIELD OF THE INVENTION

The present subject matter relates generally to heat pumps, such as magneto-caloric heat pumps.

BACKGROUND OF THE INVENTION

Conventional refrigeration technology typically utilizes a heat pump that relies on compression and expansion of a fluid refrigerant to receive and reject heat in a cyclic manner so as to effect a desired temperature change or transfer heat energy from one location to another. This cycle can be used to receive heat from a refrigeration compartment and reject such heat to the environment or a location that is external to the compartment. Other applications include air conditioning of residential or commercial structures. A variety of different fluid refrigerants have been developed that can be used with the heat pump in such systems.

While improvements have been made to such heat pump systems that rely on the compression of fluid refrigerant, at best such can still only operate at about forty-five percent or less of the maximum theoretical Carnot cycle efficiency. Also, some fluid refrigerants have been discontinued due to environmental concerns. The range of ambient temperatures over which certain refrigerant-based systems can operate may be impractical for certain locations. Other challenges with heat pumps that use a fluid refrigerant exist as well.

Magneto-caloric materials (MCMs), i.e. materials that exhibit the magneto-caloric effect, provide a potential alternative to fluid refrigerants for heat pump applications. In general, the magnetic moments of MCMs become more ordered under an increasing, externally applied magnetic field and cause the MCMs to generate heat. Conversely, decreasing the externally applied magnetic field allows the magnetic moments of the MCMs to become more disordered and allow the MCMs to absorb heat. Some MCMs exhibit the opposite behavior, i.e. generating heat when the magnetic field is removed (which are sometimes referred to as para-magneto-caloric material but both types are referred to collectively herein as magneto-caloric material or MCM). The theoretical Carnot cycle efficiency of a refrigeration cycle based on an MCMs can be significantly higher than for a comparable refrigeration cycle based on a fluid refrigerant. As such, a heat pump system that can effectively use an MCM would be useful.

Challenges exist to the practical and cost competitive use of an MCM, however. In addition to the development of suitable MCMs, equipment that can attractively utilize an MCM is still needed. Currently proposed equipment may require relatively large and expensive magnets, may be impractical for use in e.g., appliance refrigeration, and may not otherwise operate with enough efficiency to justify capital cost.

Accordingly, a heat pump system that can address certain challenges, such as those identified above, would be useful. Such a heat pump system that can also be used in a refrigerator appliance would also be useful.

BRIEF DESCRIPTION OF THE INVENTION

Aspects and advantages of the invention will be set forth in part in the following description, or may be apparent from the description, or may be learned through practice of the invention.

In a first example embodiment, a magneto-caloric thermal diode assembly includes a magneto-caloric cylinder with a plurality of magneto-caloric stages. Each of the plurality of magneto-caloric stages has a respective Currie temperature. The magneto-caloric cylinder has a length along an axial direction. The plurality of magneto-caloric stages is distributed along the length of the magneto-caloric cylinder. A plurality of thermal stages is stacked along the axial direction between a cold side and a hot side, each of the plurality of thermal stages includes a plurality of magnets and a non-magnetic ring. The plurality of magnets is distributed along a circumferential direction within the non-magnetic ring in each of the plurality of thermal stages. The plurality of thermal stages has a length along the axial direction. The length of the plurality of thermal stages is less than the length of the magneto-caloric cylinder. The plurality of thermal stages and the magneto-caloric cylinder are configured for relative rotation between the plurality of thermal stages and the magneto-caloric cylinder. The magneto-caloric cylinder is received within the plurality of thermal stages such that the magneto-caloric cylinder is movable along the axial direction relative to the plurality of thermal stages.

In a second example embodiment, a magneto-caloric thermal diode assembly includes a magneto-caloric cylinder with a plurality of magneto-caloric stages. Each of the plurality of magneto-caloric stages has a respective Currie temperature The magneto-caloric cylinder has a length along an axial direction. The plurality of magneto-caloric stages is distributed along the length of the magneto-caloric cylinder. A plurality of thermal stages is stacked along the axial direction between a cold side and a hot side. Each of the plurality of thermal stages includes a plurality of non-magnetic blocks and a magnetic ring. The plurality of non-magnetic blocks is distributed along a circumferential direction within the magnetic ring in each of the plurality of thermal stages. The plurality of thermal stages has a length along the axial direction. The length of the plurality of thermal stages is less than the length of the magneto-caloric cylinder. The plurality of thermal stages and the magneto-caloric cylinder are configured for relative rotation between the plurality of thermal stages and the magneto-caloric cylinder. The magneto-caloric cylinder is received within the plurality of thermal stages such that the magneto-caloric cylinder is movable along the axial direction relative to the plurality of thermal stages.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures.

DETAILED DESCRIPTION

Figure 1:
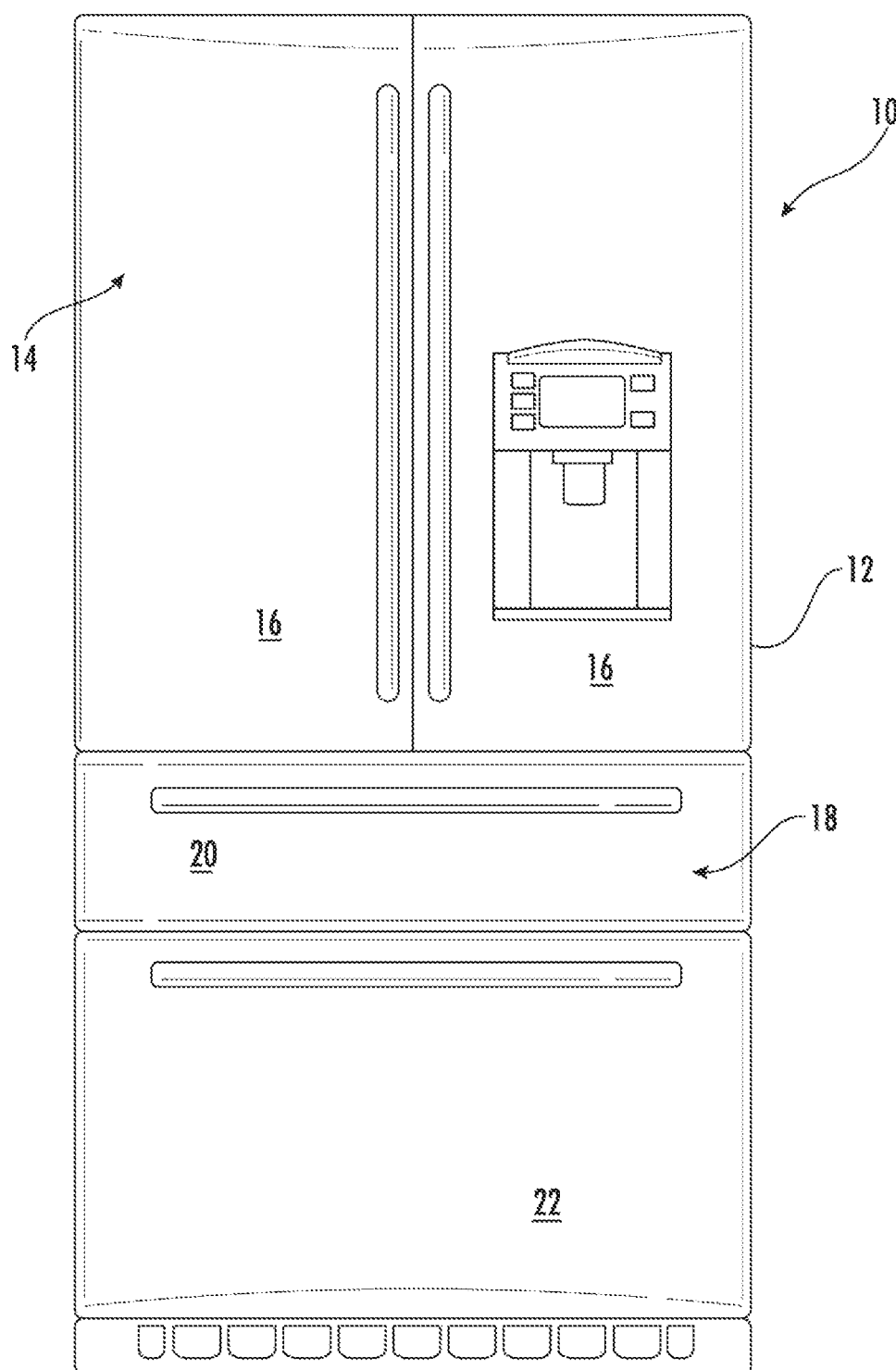
FIG. 1 is a refrigerator appliance in accordance with an example embodiment of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Referring now to FIG. 1, an exemplary embodiment of a refrigerator appliance 10 is depicted as an upright refrigerator having a cabinet or casing 12 that defines a number of internal storage compartments or chilled chambers. In particular, refrigerator appliance 10 includes upper fresh-food compartments 14 having doors 16 and lower freezer compartment 18 having upper drawer 20 and lower drawer 22. Drawers 20, 22 are "pull-out" type drawers in that they can be manually moved into and out of freezer compartment 18 on suitable slide mechanisms. Refrigerator 10 is provided by way of example only. Other configurations for a refrigerator appliance may be used as well including appliances with only freezer compartments, only chilled compartments, or other combinations thereof different from that shown in FIG. 1. In addition, the magneto-caloric thermal diode and heat pump system of the present disclosure is not limited to refrigerator appliances and may be used in other applications as well such as e.g., air-conditioning, electronics cooling devices, and others. Thus, it should be understood that while the use of a magneto-caloric thermal diode and heat pump system to provide cooling within a refrigerator is provided by way of example herein, the present disclosure may also be used to provide for heating applications as well.

Figure 2:
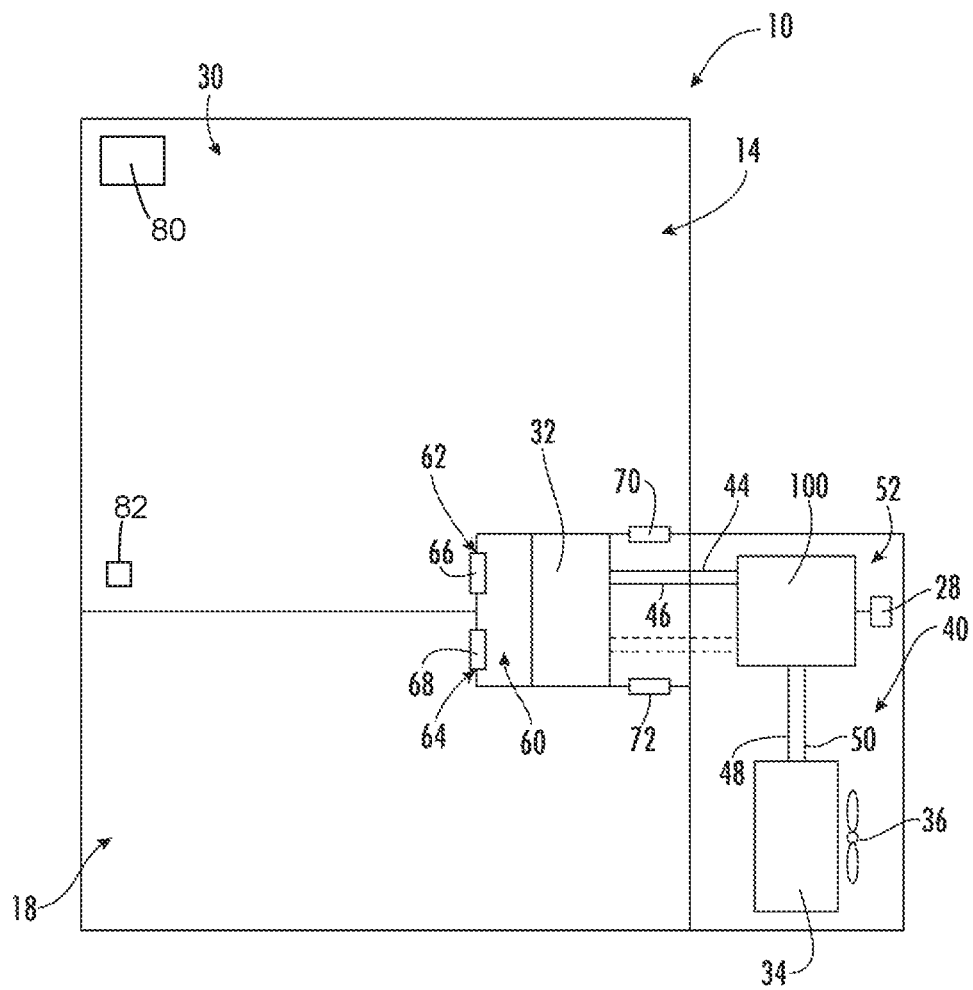
FIG. 2 is a schematic illustration of certain components of a heat pump system positioned in the example refrigerator appliance of FIG. 1.

FIG. 2 is a schematic view of various components of refrigerator appliance 10, including refrigeration compartments 30 (e.g., fresh-food compartments 14 and freezer compartment 18) and a machinery compartment 40. Refrigeration compartment 30 and machinery compartment 40 include a heat pump system 52 having a first or cold side heat exchanger 32 positioned in refrigeration compartment 30 for the removal of heat therefrom. A heat transfer fluid such as e.g., an aqueous solution, flowing within cold side heat exchanger 32 receives heat from refrigeration compartment 30 thereby cooling contents of refrigeration compartment 30.

The heat transfer fluid flows out of cold side heat exchanger 32 by line 44 to magneto-caloric thermal diode 100. As will be further described herein, the heat transfer fluid rejects heat to magneto-caloric material (MCM) in magneto-caloric thermal diode 100. The now colder heat transfer fluid flows by line 46 to cold side heat exchanger 32 to receive heat from refrigeration compartment 30.

Another heat transfer fluid carries heat from the MCM in magneto-caloric thermal diode 100 by line 48 to second or hot side heat exchanger 34. Heat is released to the environment, machinery compartment 40, and/or other location external to refrigeration compartment 30 using second heat exchanger 34. From second heat exchanger 34, the heat transfer fluid returns by line 50 to magneto-caloric thermal diode 100. The above described cycle may be repeated to suitable cool refrigeration compartment 30. A fan 36 may be used to create a flow of air across second heat exchanger 34 and thereby improve the rate of heat transfer to the environment.

A pump or pumps (not shown) cause the heat transfer fluid to recirculate in heat pump system 52. Motor 28 is in mechanical communication with magneto-caloric thermal diode 100 and is operable to provide relative motion between magnets and a magneto-caloric material of magneto-caloric thermal diode 100, as discussed in greater detail below.

Heat pump system 52 is provided by way of example only. Other configurations of heat pump system 52 may be used as well. For example, lines 44, 46, 48, and 50 provide fluid communication between the various components of heat pump system 52 but other heat transfer fluid recirculation loops with different lines and connections may also be employed. Still other configurations of heat pump system 52 may be used as well.

In certain exemplary embodiments, cold side heat exchanger 32 is the only heat exchanger within heat pump system 52 that is configured to cool refrigeration compartments 30. Thus, cold side heat exchanger 32 may be the only heat exchanger within cabinet 12 for cooling fresh-food compartments 14 and freezer compartment 18. Refrigerator appliance 10 also includes features for regulating air flow across cold side heat exchanger 32 and to fresh-food compartments 14 and freezer compartment 18.

As may be seen in FIG. 2, cold side heat exchanger 32 is positioned within a heat exchanger compartment 60 that is defined within cabinet 12, e.g., between fresh-food compartments 14 and freezer compartment 18. Fresh-food compartment 14 is contiguous with heat exchanger compartment 60 through a fresh food duct 62. Thus, air may flow between fresh-food compartment 14 and heat exchanger compartment 60 via fresh food duct 62. Freezer compartment 18 is contiguous with heat exchanger compartment 60 through a freezer duct 64. Thus, air may flow between freezer compartment 18 and heat exchanger compartment 60 via freezer duct 64.

Refrigerator appliance 10 also includes a fresh food fan 66 and a freezer fan 68. Fresh food fan 66 may be positioned at or within fresh food duct 62. Fresh food fan 66 is operable to force air flow between fresh-food compartment 14 and heat exchanger compartment 60 through fresh food duct 62. Fresh food fan 66 may thus be used to create a flow of air across cold side heat exchanger 32 and thereby improve the rate of heat transfer to air within fresh food duct 62. Freezer fan 68 may be positioned at or within freezer duct 64. Freezer fan 68 is operable to force air flow between freezer compartment 18 and heat exchanger compartment 60 through freezer duct 64. Freezer fan 68 may thus be used to create a flow of air across cold side heat exchanger 32 and thereby improve the rate of heat transfer to air within freezer duct 64.

Refrigerator appliance 10 may also include a fresh food damper 70 and a freezer damper 72. Fresh food damper 70 is positioned at or within fresh food duct 62 and is operable to restrict air flow through fresh food duct 62. For example, when fresh food damper 70 is closed, fresh food damper 70 blocks air flow through fresh food duct 62, e.g., and thus between fresh-food compartment 14 and heat exchanger compartment 60. Freezer damper 72 is positioned at or within freezer duct 64 and is operable to restrict air flow through freezer duct 64. For example, when freezer damper 72 is closed, freezer damper 72 blocks air flow through freezer duct 64, e.g., and thus between freezer compartment 18 and heat exchanger compartment 60. It will be understood that the positions of fans 66, 68 and dampers 70, 72 may be switched in alternative exemplary embodiments.

Operation of heat pump system 52 and fresh food fan 66 while fresh food damper 70 is open, allows chilled air from cold side heat exchanger 32 to cool fresh-food compartment 14, e.g., to about forty degrees Fahrenheit (40° F.). Similarly, operation of heat pump system 52 and freezer fan 68 while freezer damper 72 is open, allows chilled air from cold side heat exchanger 32 to cool freezer compartment 18, e.g., to about negative ten degrees Fahrenheit (−10° F.). Thus, cold side heat exchanger 32 may chill either fresh-food compartment 14 or freezer compartment 18 during operation of heat pump system 52. In such a manner, both fresh-food compartments 14 and freezer compartment 18 may be air cooled with cold side heat exchanger 32.

As may be seen in FIG. 2, refrigerator appliance 10 may include a computing device or controller 80. Controller 80 is operatively coupled or in communication with various components of refrigerator appliance 10. The components include, e.g., motor 28, fresh food fan 66, freezer fan 68, fresh food damper 70, freezer damper 72, etc. Controller 80 can selectively operate such components in response to temperature measurement from a temperature sensor 82. Temperature sensor 82 may, e.g., measure the temperature of fresh-food compartments 14, freezer compartment 18, or ambient air around cabinet 12.

Controller 80 may be positioned in a variety of locations throughout refrigerator appliance 10. For example, controller 80 may be disposed in cabinet 12. Input/output ("I/O") signals may be routed between controller 80 and various operational components of refrigerator appliance 10. The components of temperature refrigerator appliance 10 may be in communication with controller 80 via one or more signal lines or shared communication busses.

Controller 80 can be any device that includes one or more processors and a memory. As an example, in some embodiments, controller 80 may be a single board computer (SBC). For example, controller 80 can be a single System-On-Chip (SOC). However, any form of controller 80 may also be used to perform the present subject matter. The processor(s) can be any suitable processing device, such as a microprocessor, microcontroller, integrated circuit, or other suitable processing devices or combinations thereof. The memory can include any suitable storage media, including, but not limited to, non-transitory computer-readable media, RAM, ROM, hard drives, flash drives, accessible databases, or other memory devices. The memory can store information accessible by processor(s), including instructions that can be executed by processor(s) to perform aspects of the present disclosure.

FIGS. 3 through 8 are various views of magneto-caloric thermal diode 200 according to an example embodiment of the present subject matter. Magneto-caloric thermal diode 200 may be used in any suitable heat pump system. For example, magneto-caloric thermal diode 200 may be used in heat pump system 52 (FIG. 2). As discussed in greater detail below, magneto-caloric thermal diode 200 includes features for transferring thermal energy from a cold side 202 of magneto-caloric thermal diode 200 to a hot side 204 of magneto-caloric thermal diode 200. Magneto-caloric thermal diode 200 defines an axial direction A, a radial direction R and a circumferential direction C.

Magneto-caloric thermal diode 200 includes a plurality of thermal stages 210. Thermal stages 210 are stacked along the axial direction A between cold side 202 and hot side 204 of magneto-caloric thermal diode 200. A cold side thermal stage 212 of thermal stages 210 is positioned at cold side 202 of magneto-caloric thermal diode 200, and a hot side thermal stage 214 of thermal stages 210 is positioned at hot side 204 of magneto-caloric thermal diode 200.

Figure 8:
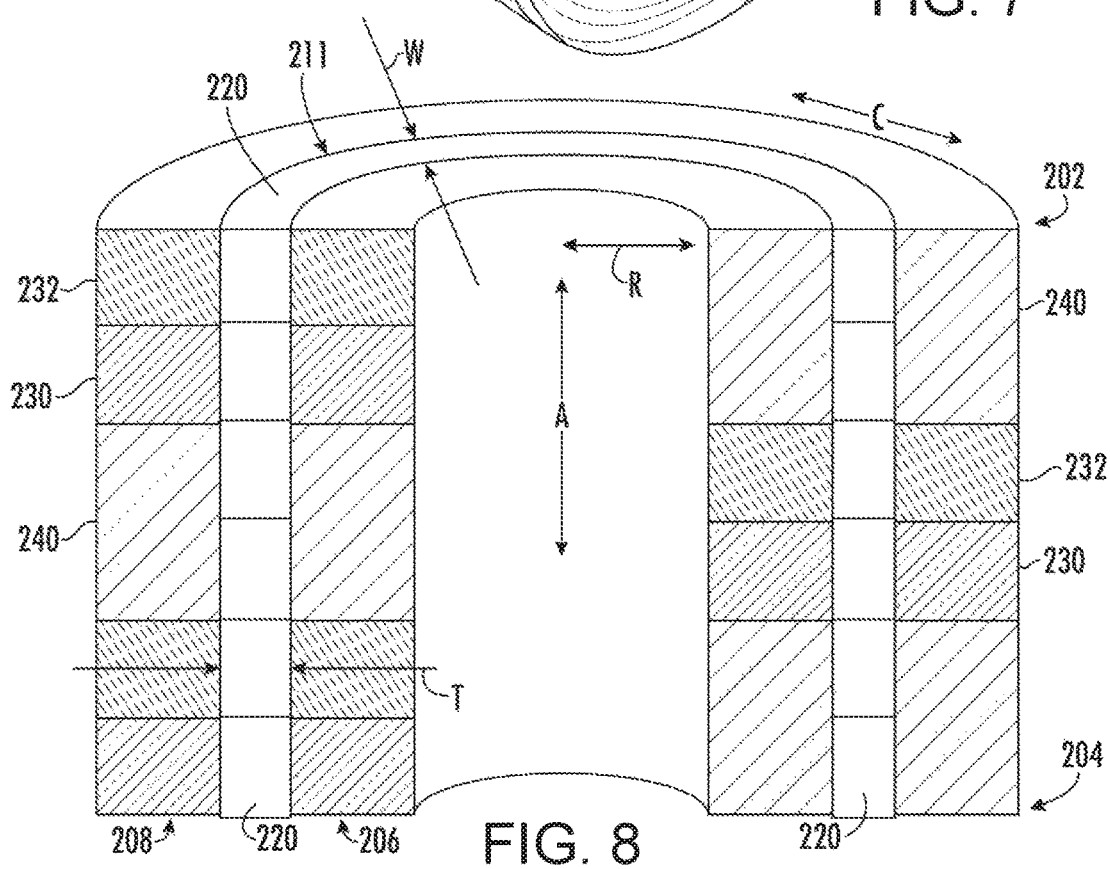
FIG. 8 is a schematic view of the certain components of the example magneto-caloric thermal diode of FIG. 3.

Magneto-caloric thermal diode 200 also includes a magneto-caloric cylinder 220 (FIG. 8). In certain example embodiments, thermal stages 210 define a cylindrical slot 211, and magneto-caloric cylinder 220 is positioned within cylindrical slot 211. Thus, e.g., each thermal stage 210 may include an inner section 206 and an outer section 208 that are spaced from each other along the radial direction R by cylindrical slot 211 such that magneto-caloric cylinder 220 is positioned between inner and outer sections 206, 208 of thermal stages 210 along the radial direction R. Thermal stages 210 and magneto-caloric cylinder 220 are configured for relative rotation between thermal stages 210 and magneto-caloric cylinder 220. Thermal stages 210 and magneto-caloric cylinder 220 may be configured for relative rotation about an axis X that is parallel to the axial direction A. As an example, magneto-caloric cylinder 220 may be coupled to motor 26 such that magneto-caloric cylinder 220 is rotatable relative to thermal stages 210 about the axis X within cylindrical slot 211 with motor 26. In alternative exemplary embodiments, thermal stages 210 may be coupled to motor 26 such that thermal stages 210 are rotatable relative to magneto-caloric cylinder 220 about the axis X with motor 26.

During relative rotation between thermal stages 210 and magneto-caloric cylinder 220, magneto-caloric thermal diode 200 transfers heat from cold side 202 to hot side 204 of magneto-caloric thermal diode 200. In particular, during relative rotation between thermal stages 210 and magneto-caloric cylinder 220, cold side thermal stage 212 may absorb heat from fresh-food compartments 14 and/or freezer compartment 18, and hot side thermal stage 214 may reject heat to the ambient atmosphere about refrigerator appliance 10.

Each of the thermal stages 210 includes a plurality of magnets 230 and a non-magnetic ring 240. Magnets 230 are distributed along the circumferential direction C within non-magnetic ring 240 in each thermal stage 210. In particular, magnets 230 may be spaced from non-magnetic ring 240 along the radial direction R and the circumferential direction C within each thermal stage 210. For example, each of the thermal stages 210 may include insulation 232, and insulation 232 may be positioned between magnets 230 and non-magnetic ring 240 along the radial direction R and the circumferential direction C within each thermal stage 210. Insulation 232 may limit conductive heat transfer between magnets 230 and non-magnetic ring 240 within each thermal stage 210. As another example, magnets 230 may be spaced from non-magnetic ring 240 along the radial direction R and the circumferential direction C by a gap within each thermal stage 210. The gap between magnets 230 and non-magnetic ring 240 within each thermal stage 210 may limit or prevent conductive heat transfer between magnets 230 and non-magnetic ring 240 within each thermal stage 210.

It will be understood that the arrangement magnets 230 and non-magnetic ring 240 may be flipped in alternative example embodiments. Thus, e.g., a steel and magnet ring may be thermally separate from non-magnetic blocks, e.g., aluminum blocks, within each thermal stage 210. Operation magneto-caloric thermal diode 200 is the same in such configuration.

As may be seen from the above, thermal stages 210 may include features for limiting heat transfer along the radial direction R and the circumferential direction C within each thermal stage 210. Conversely, thermal stages 210 may be arranged to provide a flow path for thermal energy along the axial direction A from cold side 202 to hot side 204 of magneto-caloric thermal diode 200. Such arrangement of thermal stages 210 is discussed in greater detail below.

As noted above, thermal stages 210 includes cold side thermal stage 212 at cold side 202 of magneto-caloric thermal diode 200 and hot side thermal stage 214 at hot side 204 of magneto-caloric thermal diode 200. Thus, cold side thermal stage 212 and hot side thermal stage 214 may correspond to the terminal ends of the stack of thermal stages 210. In particular, cold side thermal stage 212 and hot side thermal stage 214 may be positioned opposite each other along the axial direction A on the stack of thermal stages 210. The other thermal stages 210 are positioned between cold side thermal stage 212 and hot side thermal stage 214 along the axial direction A. Thus, e.g., interior thermal stages 216 (i.e., the thermal stages 210 other than cold side thermal stage 212 and hot side thermal stage 214) are positioned between cold side thermal stage 212 and hot side thermal stage 214 along the axial direction A.

Each of the interior thermal stages 216 is positioned between a respective pair of thermal stages 210 along the axial direction A. One of the respective pair of thermal stages 210 is positioned closer to cold side 202 along the axial direction A, and the other of the respective pair of thermal stages 210 is positioned closer to hot side 204 along the axial direction A. For example, a first one 217 of interior thermal stages 216 is positioned between hot side thermal stage 214 and a second one 218 of interior thermal stages 216 along the axial direction A. Similarly, second one 218 of interior thermal stages 216 is positioned between first one 217 of interior thermal stages 216 and a third one 219 of interior thermal stages 216 along the axial direction A.

Each of the interior thermal stages 216 is arranged to provide a flow path for thermal energy along the axial direction A from cold side thermal stage 212 to hot side thermal stage 214. In particular, magnets 230 of each of interior thermal stages 216 may be spaced from non-magnetic ring 240 of the one of the respective pair of thermal stages 210 along the axial direction A. Thus, e.g., magnets 230 of first one 217 of interior thermal stages 216 may be spaced from non-magnetic ring 240 of second one 218 of interior thermal stages 216 along the axial direction A. Similarly, magnets 230 of second one 218 of interior thermal stages 216 may be spaced from non-magnetic ring 240 of third one 219 of interior thermal stages 216 along the axial direction A. Hot side thermal stage 214 may also be arranged in such a manner.

By spacing magnets 230 of each of interior thermal stages 216 from non-magnetic ring 240 of the one of the respective pair of thermal stages 210 along the axial direction A, conductive heat transfer along the axial direction A from magnets 230 of each of interior thermal stages 216 to non-magnetic ring 240 of an adjacent one of thermal stages 210 towards cold side 202 along the axial direction A may be limited or prevented. In certain example embodiments, magneto-caloric thermal diode 200 may include insulation 250. Magnets 230 of each of interior thermal stages 216 may be spaced from non-magnetic ring 240 of the one of the respective pair of thermal stages 210 along the axial direction A by insulation 250. Insulation 250 may limit conductive heat transfer along the axial direction A from magnets 230 of each of interior thermal stages 216 to non-magnetic ring 240 of an adjacent one of thermal stages 210 towards cold side 202 along the axial direction A.

Magnets 230 of each of interior thermal stages 216 may also be in conductive thermal contact with non-magnetic ring 240 of the other of the respective pair of thermal stages 210. Thus, e.g., magnets 230 of first one 217 of interior thermal stages 216 may be in conductive thermal contact with non-magnetic ring 240 of hot side thermal stage 214. Similarly, magnets 230 of second one 218 of interior thermal stages 216 may be in conductive thermal contact with non-magnetic ring 240 of first one 217 of interior thermal stages 216. Cold side thermal stage 212 may also be arranged in such a manner.

By placing magnets 230 of each of interior thermal stages 216 in conductive thermal contact with non-magnetic ring 240 of the other of the respective pair of thermal stages 210, thermal energy flow along the axial direction A towards hot side 204 may be facilitated, e.g., relative to towards cold side 202. In certain example embodiments, magnets 230 of each of interior thermal stages 216 may be positioned to directly contact non-magnetic ring 240 of the other of the respective pair of thermal stages 210. For example, non-magnetic ring 240 of the other of the respective pair of thermal stages 210 may include projections 242 that extend along the axial direction A to magnets 230 of each of interior thermal stages 216.

The above described arrangement of thermal stages 210 may provide a flow path for thermal energy along the axial direction A from cold side 202 to hot side 204 of magneto-caloric thermal diode 200 during relative rotation between thermal stages 210 and magneto-caloric cylinder 220. Operation of magneto-caloric thermal diode 200 to transfer thermal energy along the axial direction A from cold side 202 to hot side 204 of magneto-caloric thermal diode 200 will now be described in greater detail below.

Magnets 230 of thermal stages 210 produce a magnetic field. Conversely, non-magnetic rings 240 do not produce a magnetic field or produce a negligible magnetic field relative to magnets 230. Thus, each of the magnets 230 may correspond to a high magnetic field zone, and the portion of non-magnetic rings 240 between magnets 230 along the circumferential direction C within each thermal stage 210 may correspond to a low magnetic field zone. During relative rotation between thermal stages 210 and magneto-caloric cylinder 220, magneto-caloric cylinder 220 may be sequentially exposed to the high magnetic field zone at magnets 230 and the low magnetic field zone at non-magnetic rings 240.

Magneto-caloric cylinder 220 includes a magneto-caloric material that exhibits the magneto-caloric effect, e.g., when exposed to the magnetic field from magnets 230 of thermal stages 210. The caloric material may be constructed from a single magneto-caloric material or may include multiple different magneto-caloric materials. By way of example, refrigerator appliance 10 may be used in an application where the ambient temperature changes over a substantial range. However, a specific magneto-caloric material may exhibit the magneto-caloric effect over only a much narrower temperature range. As such, it may be desirable to use a variety of magneto-caloric materials within magneto-caloric cylinder 220 to accommodate the wide range of ambient temperatures over which refrigerator appliance 10 and/or magneto-caloric thermal diode 200 may be used.

Accordingly, magneto-caloric cylinder 220 can be provided with zones of different magneto-caloric materials. Each such zone may include a magneto-caloric material that exhibits the magneto-caloric effect at a different temperature or a different temperature range than an adjacent zone along the axial direction A of magneto-caloric cylinder 220. By configuring the appropriate number sequence of zones of magneto-caloric material, magneto-caloric thermal diode 200 can be operated over a substantial range of ambient temperatures.

As noted above, magneto-caloric cylinder 220 includes magneto-caloric material that exhibits the magneto-caloric effect. During relative rotation between thermal stages 210 and magneto-caloric cylinder 220, the magneto-caloric material in magneto-caloric cylinder 220 is sequentially exposed to the high magnetic field zone at magnets 230 and the low magnetic field zone at non-magnetic rings 240. When the magneto-caloric material in magneto-caloric cylinder 220 is exposed to the high magnetic field zone at magnets 230, the magnetic field causes the magnetic moments of the magneto-caloric material in magneto-caloric cylinder 220 to orient and to increase (or alternatively decrease) in temperature such that the magneto-caloric material in magneto-caloric cylinder 220 rejects heat to magnets 230. Conversely, when the magneto-caloric material in magneto-caloric cylinder 220 is exposed to the low magnetic field zone at non-magnetic rings 240, the decreased magnetic field causes the magnetic moments of the magneto-caloric material in magneto-caloric cylinder 220 to disorient and to decrease (or alternatively increase) in temperature such that the magneto-caloric material in magneto-caloric cylinder 220 absorbs heat from non-magnetic rings 240. By rotating through the high and low magnetic field zones, magneto-caloric cylinder 220 may transfer thermal energy along the axial direction A from cold side 202 to hot side 204 of magneto-caloric thermal diode 200 by utilizing the magneto-caloric effect of the magneto-caloric material in magneto-caloric cylinder 220.

As noted above, the high magnetic field zones at magnets 230 in each of thermal stages 210 (e.g., other than hot side thermal stage 214) is in conductive thermal contact with the low magnetic field zone at the non-magnetic ring 240 of an adjacent thermal stages 210 in the direction of hot side 204 along the axial direction A. Thus, the non-magnetic ring 240 of the adjacent thermal stages 210 in the direction of hot side 204 may absorb heat from the high magnetic field zones at magnets 230 in each of thermal stages 210. Thus, thermal stages 210 are arranged to encourage thermal energy flow through thermal stages 210 from cold side 202 towards hot side 204 along the axial direction A during relative rotation between thermal stages 210 and magneto-caloric cylinder 220.

Conversely, the high magnetic field zones at magnets 230 in each of thermal stages 210 (e.g., other than cold side thermal stage 212) is spaced from the low magnetic field zone at the non-magnetic ring 240 of an adjacent thermal stages 210 in the direction of cold side 202 along the axial direction A. Thus, the non-magnetic ring 240 of the adjacent thermal stages 210 in the direction of cold side 202 is thermally isolated from the high magnetic field zones at magnets 230 in each of thermal stages 210. Thus, thermal stages 210 are arranged to discourage thermal energy flow through thermal stages 210 from hot side 204 towards cold side 202 along the axial direction A during relative rotation between thermal stages 210 and magneto-caloric cylinder 220.

Figure 3:
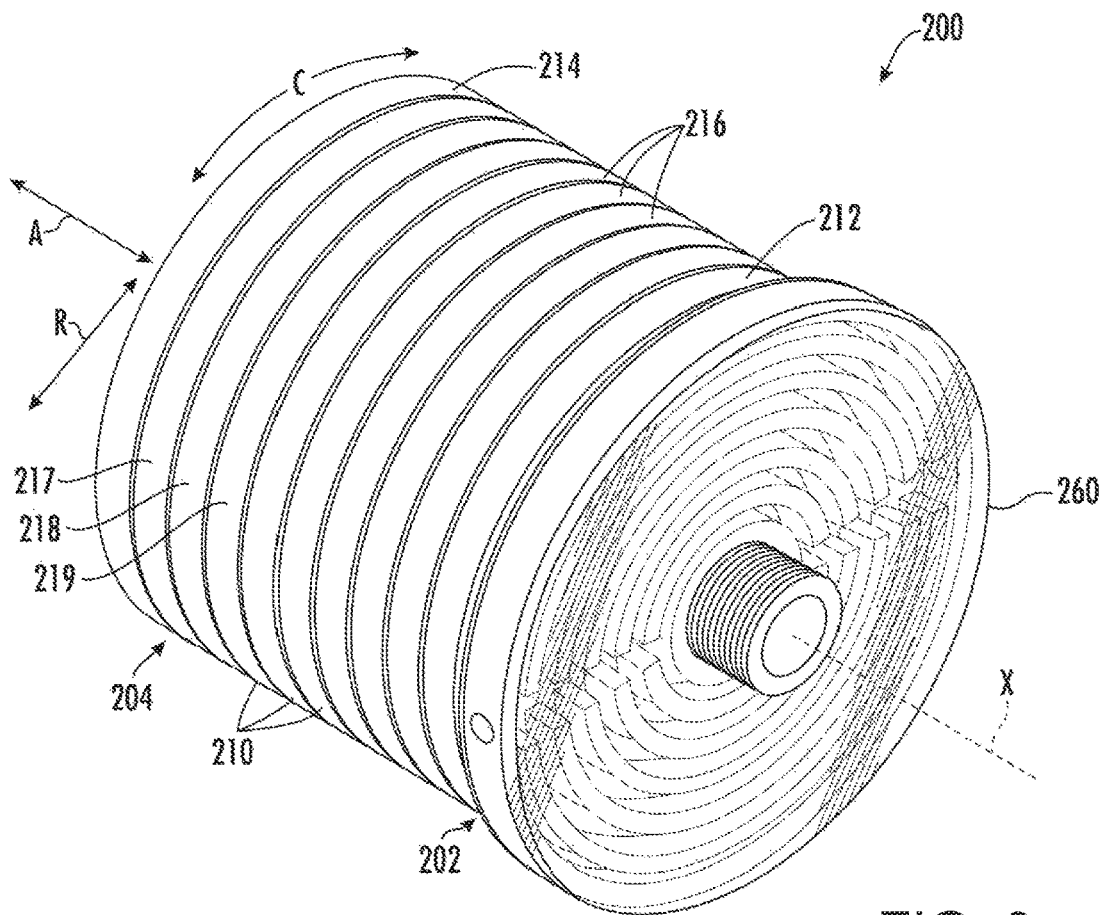
FIG. 3 is a perspective view of a magneto-caloric thermal diode according to an example embodiment of the present subject matter.
Figure 4:
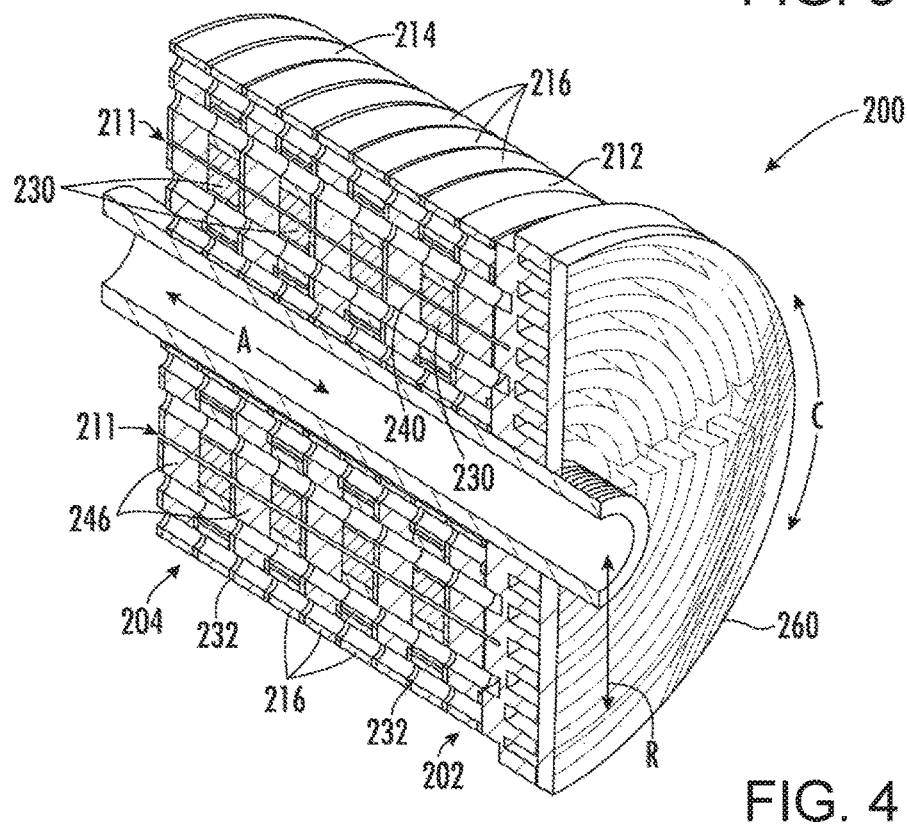
FIG. 4 is a section view of the example magneto-caloric thermal diode of FIG. 3.
Figure 5:
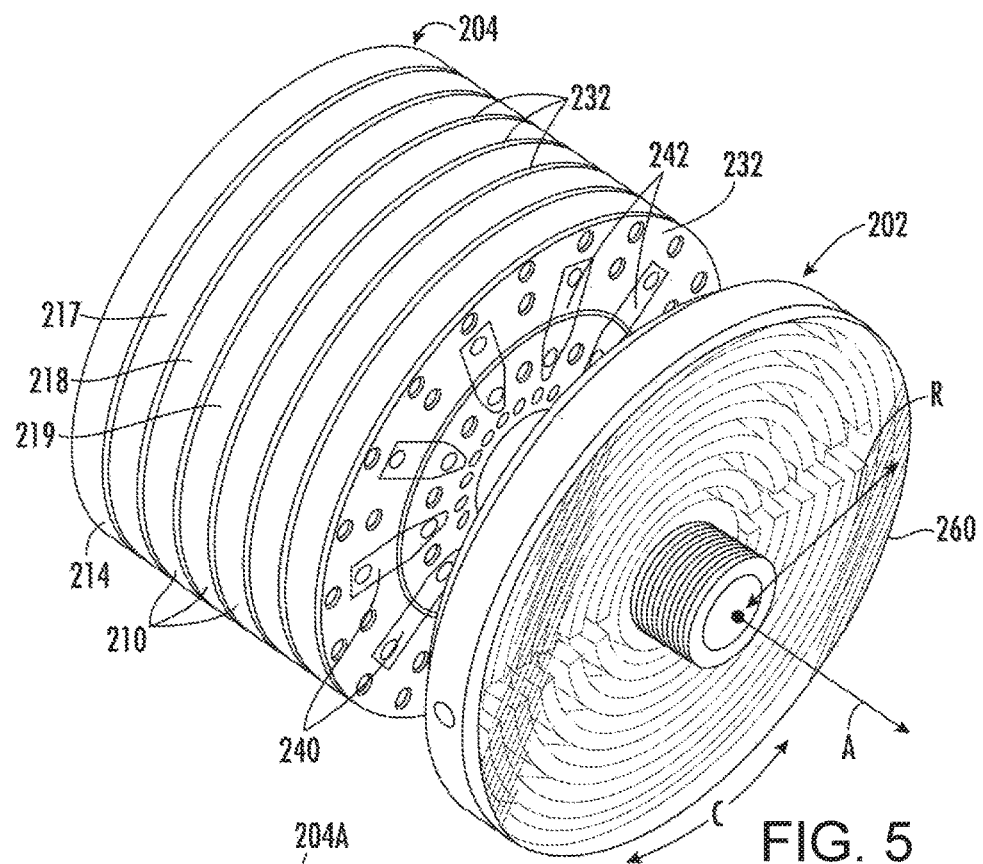
FIG. 5 is a perspective view of the example magneto-caloric thermal diode of FIG. 3 with certain thermal stages removed from the example magneto-caloric thermal diode.
Figure 6:
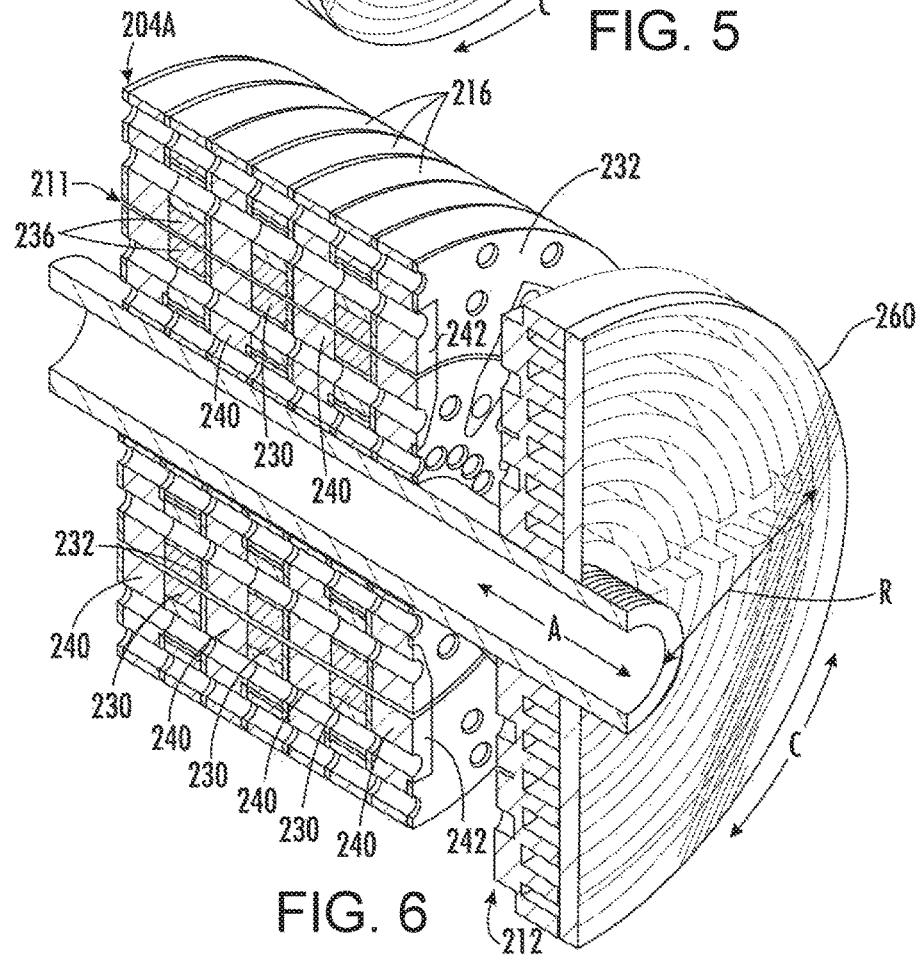
FIG. 6 is a section view of the example magneto-caloric thermal diode of FIG. 5.
Figure 7:
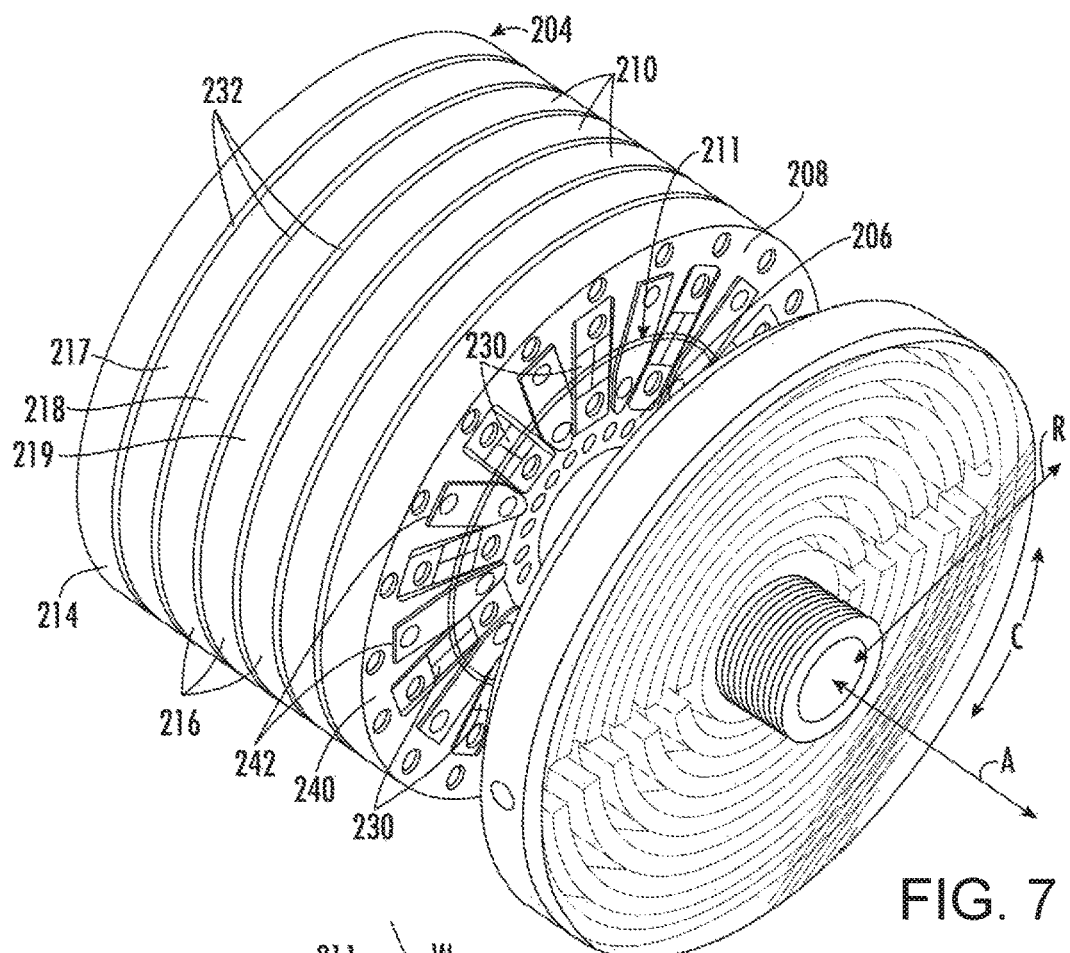
FIG. 7 is a perspective view of the example magneto-caloric thermal diode of FIG. 5 with an insulation layer removed from the example magneto-caloric thermal diode.

Magneto-caloric thermal diode 200 may include a suitable number of thermal stages 210. For example, thermal stages 210 may include nine thermal stages as shown in FIGS. 3 and 4. In alternative example embodiments, thermal stages 210 may include no less than seven thermal stages. Such number of thermal stages 210 may advantageously permit magneto-caloric cylinder 220 to include a corresponding number of zones with different magneto-caloric materials and thereby allow magneto-caloric thermal diode 200 to operate over a wide range of ambient temperatures as discussed above. Magneto-caloric thermal diode 200 may have an odd number of thermal stages 210.

Each of magnets 230 in thermal stages 210 may be formed as a magnet pair 236. One of magnet pair 236 may be mounted to or positioned at inner section 206 of each thermal stage 210, and the other of magnet pair 236 may be mounted to or positioned at outer section 208 of each thermal stage 210. Thus, magneto-caloric cylinder 220 may be positioned between the magnets of magnet pair 236 along the radial direction R at cylindrical slot 211. A positive pole of one of magnet pair 236 and a negative pole of other of magnet pair 236 may face magneto-caloric cylinder 220 along the radial direction R at cylindrical slot 211.

Cylindrical slot 211 may be suitably sized relative to magneto-caloric cylinder 220 to facilitate efficient heat transfer between thermal stages 210 and magneto-caloric cylinder 220. For example, cylindrical slot 211 may have a width W along the radial direction R, and magneto-caloric cylinder 220 may having a thickness T along the radial direction R within cylindrical slot 211. The width W of cylindrical slot 211 may no more than five hundredths of an inch (0.05") greater than the thickness T of magneto-caloric cylinder 220 in certain example embodiments. For example, the width W of cylindrical slot 211 may about one hundredth of an inch (0.01") greater than the thickness T of magneto-caloric cylinder 220 in certain example embodiments. As used herein, the term "about" means within five thousandths of an inch (0.005") when used in the context of radial thicknesses and widths. Such sizing of cylindrical slot 211 relative to magneto-caloric cylinder 220 can facilitate efficient heat transfer between thermal stages 210 and magneto-caloric cylinder 220.

Each thermal stage 210 may include a suitable number of magnets 230. For example, each thermal stage 210 may include no less than ten (10) magnets 230 in certain example embodiments. With such a number of magnets 230, may advantageously improve performance of magneto-caloric thermal diode 200, e.g., by driving a larger temperature difference between cold side 202 and hot side 204 relative to a smaller number of magnets 230.

Magnets 230 may also be uniformly spaced apart along the circumferential direction C within the non-magnetic ring 240 in each of thermal stages 210. Further, each of thermal stages 210 may be positioned at a common orientation with every other one of thermal stages 210 within the stack of thermal stages 210. Thus, e.g., first one 217 of interior thermal stages 216 may be positioned at a common orientation with third one 219 of interior thermal stages 216, and hot side thermal stage 214 may be positioned at a common orientation with second one 218 of interior thermal stages 216. As may be seen from the above, the common orientation may sequentially skip one thermal stage 214 with the stack of thermal stages 210. Between adjacent thermal stages 210 within the stack of thermal stages 210, each magnet 230 of thermal stages 210 may be positioned equidistance along the circumferential direction C from a respective pair of magnets 230 in adjacent thermal stages 210.

The non-magnetic rings 240 of thermal stage 210 may be constructed of or with a suitable non-magnetic material. For example, the non-magnetic rings 240 of thermal stage 210 may be constructed of or with aluminum in certain example embodiments. In alternative example embodiments, the non-magnetic rings 240 of thermal stage 210 may be constructed of or with brass, bronze, etc.

Magneto-caloric thermal diode 200 may also include one or more heat exchangers 260. In FIG. 3, heat exchanger 260 is shown positioned at the cold side 202 such that heat exchanger 260 absorbs heat from cold side thermal stage 212. A heat transfer fluid may flow between heat exchanger 260 and cold side heat exchanger 32 via lines 44, 46 as discussed above. Another heat exchanger may be positioned hot side 204 such that a heat transfer fluid may flow between the heat exchanger and hot side heat exchanger 34 via lines 48, 50 as discussed above. The heat exchangers (including heat exchanger 260) may be solid-liquid heat exchangers with a port for heat transfer fluid. Alternatively, the heat exchangers could be direct to solid-gas heat exchangers.

As discussed above, motor 28 is in mechanical communication with magneto-caloric thermal diode 200 and is operable to provide relative rotation between thermal stages 210 and magneto-caloric cylinder 220. In particular, motor 28 may be coupled to one of thermal stages 210 and magneto-caloric cylinder 220, and motor 28 may be operable to rotate the one of thermal stages 210 and magneto-caloric cylinder 220 relative to the other of thermal stages 210 and magneto-caloric cylinder 220.

Motor 28 may be a variable speed motor. Thus, a speed of the relative rotation between thermal stages 210 and magneto-caloric cylinder 220 may be adjusted by changing the speed of motor 28. In particular, a speed of motor 28 may be changed in order to adjust the rotation speed of the one of thermal stages 210 and magneto-caloric cylinder 220 relative to the other of thermal stages 210 and magneto-caloric cylinder 220. Varying the speed of motor 28 may allow magneto-caloric thermal diode 200 to be sized to an average thermal load for magneto-caloric thermal diode 200 rather than a maximum thermal load for magneto-caloric thermal diode 200 thereby providing more efficient overall functionality.

Controller 80 may be configured to vary the speed of motor 28 in response to various conditions. For example, controller 80 may vary the speed of motor 28 in response to temperature measurements from temperature sensor 82. In particular, controller 80 may be vary the speed of motor 28 in a proportional, a proportional-integral, a proportional-derivative or a proportional-integral-derivative manner to maintain a set temperature in fresh-food compartments 14 and/or freezer compartment 18 with magneto-caloric thermal diode 200. As another example, controller 80 may increase the speed of motor 28 from a normal speed based upon a temperature limit, unit start-up, or some other trigger. As yet another example, controller 80 may vary the speed of motor 28 based on any application specific signal from an appliance with magneto-caloric thermal diode 200, such as a humidity level in a dryer appliance, a dishwasher appliance, a dehumidifier, or an air conditioners or when a door opens in refrigerator appliance 10.

Figure 9:
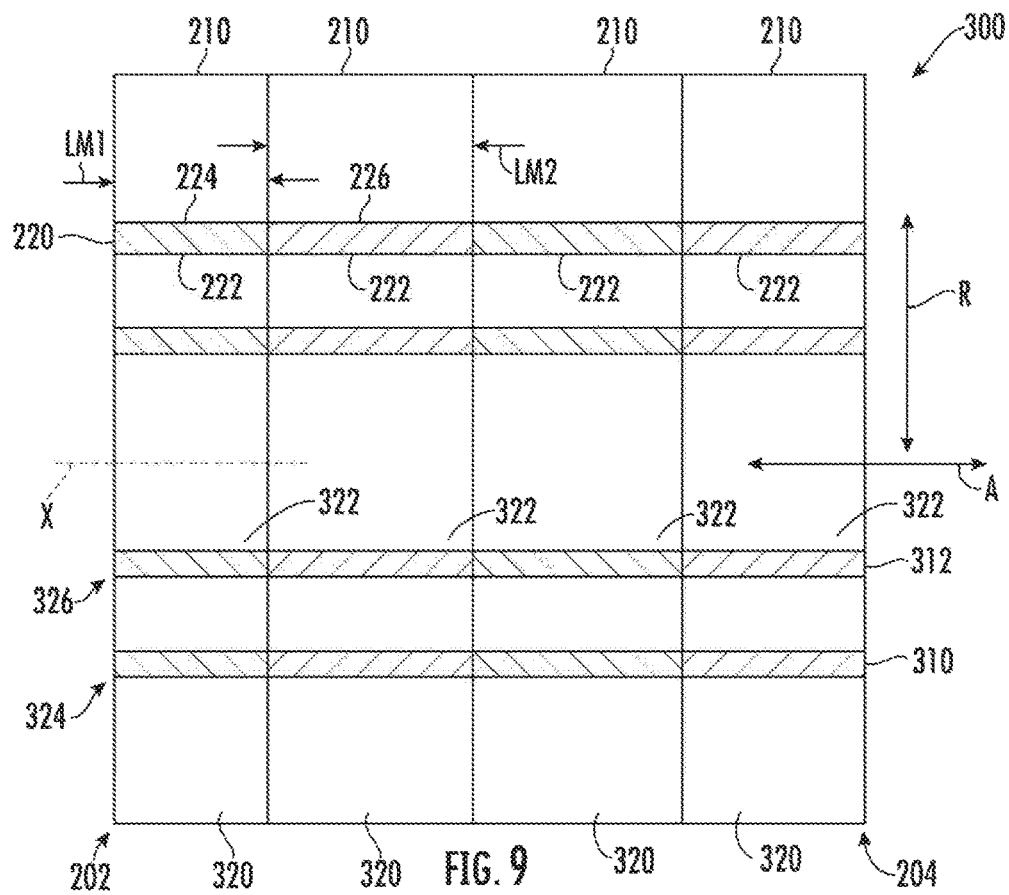
FIG. 9 is a schematic view of the certain components of a magneto-caloric thermal diode according to another example embodiment of the present subject matter.

FIG. 9 is a schematic view of the certain components of a magneto-caloric thermal diode 300 according to another example embodiment of the present subject matter. As shown in FIG. 9, magneto-caloric thermal diode 300 includes numerous common components with magneto-caloric thermal diode 200. Thus, the description of magneto-caloric thermal diode 200 provided above is applicable to magneto-caloric thermal diode 300 except as otherwise noted. In addition, magneto-caloric thermal diode 200 may include one or more of the aspects of magneto-caloric thermal diode 300 discussed below.

In magneto-caloric thermal diode 300, magneto-caloric cylinder 220 includes a plurality of magneto-caloric stages 222. Magneto-caloric stages 222 are distributed along the axial direction A within magneto-caloric cylinder 220. Each of magneto-caloric stages 222 may have a different magneto-caloric material. For example, the respective magneto-caloric material within each of magneto-caloric stages 222 may be selected such that the Currie temperature of the magneto-caloric materials decreases from hot side 204 to cold side 202 along the axial direction A. In such a manner, a cascade of magneto-caloric materials may be formed within magneto-caloric cylinder 220 along the axial direction A.

Each of magneto-caloric stages 222 may also have a respective length along the axial direction A. In particular, a length LM1 of a first one 224 of magneto-caloric stages 222 may be different than the length LM2 of a second one 226 of magneto-caloric stages 222. It will be understood that each magneto-caloric stage 222 may have a different length in the manner described above for first one 224 and second one 226 of magneto-caloric stages 222 in certain example embodiments. However, in alternative example embodiments, one or more of magneto-caloric stages 222 may have a common length with first one 224 or second one 226 of magneto-caloric stages 222.

Each of thermal stages 210 also having a respective length along the axial direction A. The length of each of thermal stages 210 corresponds to a respective one of magneto-caloric stages 222. Thus, each of thermal stages 210 may be sized to match the respective one of magneto-caloric stages 222 along the axial direction A. The respective one of magneto-caloric stages 222 is disposed with each thermal stage 210.

The length of each of magneto-caloric stages 222 along the axial direction A may be selected to assist with matching heat transfer power, e.g., such that each of magneto-caloric stages 222 accepts heat to one adjacent magneto-caloric stage 222 and rejects heat to the other adjacent magnetocaloric stage 222 along the axial direction A. Within each magneto-caloric stage 222, the rejected heat may be slightly more than the accepted heat based on stage efficiency, and the length of each of magneto-caloric stages 222 along the axial direction A may be selected to complement the efficiency of each magneto-caloric stage 222.

As an example, the length of each of magneto-caloric stages 222 may correspond to a respective Curie temperature spacing between adjacent magneto-caloric stages 222. In particular, the Curie temperature spacing for the first one 224 of magneto-caloric stages 222 may be greater than the Curie temperature spacing for the second one 226 of magneto-caloric stages 222. Thus, the length LM1 of first one 224 of magneto-caloric stages 222 may be greater than the length of LM2 of second one 226 of magneto-caloric stages 222, e.g., in proportion to the difference between the Curie temperature spacing. As may be seen from the above, magneto-caloric stages 222 with larger Curie temperature spacing between adjacent magneto-caloric stages 222 may advantageously have an increased length along the axial direction A relative to magneto-caloric stages 222 with smaller Curie temperature spacing between adjacent magneto-caloric stages 222.

As another example, the length of each of magneto-caloric stages 222 may correspond to an adiabatic temperature change (i.e., the strength) of the magneto-caloric stage 222. In particular, the adiabatic temperature change of the first one 224 of magneto-caloric stages 222 may be less than the adiabatic temperature change of the second one 226 of magneto-caloric stages 222. Thus, the length LM1 of first one 224 of magneto-caloric stages 222 may be greater than the length of LM2 of second one 226 of magneto-caloric stages 222, e.g., in proportion to the difference between the adiabatic temperature changes. As may be seen from the above, weaker magneto-caloric stages 222 may advantageously have an increased length along the axial direction A relative to stronger magneto-caloric stages 222.

As an additional example, the length of hot side thermal stage 214 along the axial direction A may be greater than the length of cold side thermal stage 212 along the axial direction A. Thus, magneto-caloric stages 222 at or adjacent hot side 204 may be longer along the axial direction A relative to magneto-caloric stages 222 at or adjacent cold side 202. In such a manner, magneto-caloric thermal diode 300 may advantageously configured to account for losses in magneto-caloric stages 222, e.g., where rejected heat is greater than accepted heat.

Magneto-caloric thermal diode 300 also includes multiple magneto-caloric cylinders 220 and multiple stacks of thermal stages 210 nested concentrically within each other. In particular, magneto-caloric thermal diode 300 includes a first magneto-caloric cylinder 310 and a second magneto-caloric cylinder 312. Second magneto-caloric cylinder 312 is positioned within first magneto-caloric cylinder 310 along the radial direction R. Magneto-caloric thermal diode 300 also includes a first plurality of thermal stages 320 and a second plurality of thermal stages 322. First thermal stages 320 are stacked along the axial direction A between cold side 202 and hot side 204. Second thermal stages 322 are also stacked along the axial direction A between cold side 202 and hot side 204. First thermal stages 320 are positioned within second thermal stages 322 along the radial direction R.

First and second thermal stages 320, 322 and first and second magneto-caloric cylinders 310, 312 are configured for relative rotation between first and second thermal stages 320, 322 and first and second magneto-caloric cylinders 310, 312. First and second thermal stages 320, 322 and first and second magneto-caloric cylinders 310, 312 may be configured for relative rotation about the axis X that is parallel to the axial direction A. As an example, first and second magneto-caloric cylinders 310, 312 may be coupled to motor 26 such that first and second magneto-caloric cylinders 310, 312 are rotatable relative to first and second thermal stages 320, 322 about the axis X with motor 26. In alternative exemplary embodiments, first and second thermal stages 320, 322 may be coupled to motor 26 such that first and second thermal stages 320, 322 are rotatable relative to first and second magneto-caloric cylinders 310, 312 about the axis X with motor 26.

First thermal stages 320 define a first cylindrical slot 324, and first magneto-caloric cylinder 310 is received within first cylindrical slot 324. Second thermal stages 322 define a second cylindrical slot 326, and second magneto-caloric cylinder 312 is received within second cylindrical slot 326. Second cylindrical slot 326 is positioned inward of first cylindrical slot 324 along the radial direction R.

First magneto-caloric cylinder 310 and first thermal stages 320 operate in the manner described above for thermal stages 210 and magneto-caloric cylinder 220 to transfer thermal energy along the axial direction A from cold side 202 to hot side 204. Similarly, second magneto-caloric cylinder 312 and second thermal stages 322 also operate in the manner described above for thermal stages 210 and magneto-caloric cylinder 220 to transfer thermal energy along the axial direction A from cold side 202 to hot side 204.

Second magneto-caloric cylinder 312 and second thermal stages 322 are nested concentrically within first magneto-caloric cylinder 310 and first thermal stages 320. In such a manner, magneto-caloric thermal diode 300 may include components for operating as multiple magneto-caloric thermal diodes 200 nested concentrically. First and second magneto-caloric cylinders 310, 312 may have identical cascades of magneto-caloric materials along the axial direction A. Thus, e.g., first and second magneto-caloric cylinders 310, 312 may have identical magneto-caloric materials along the radial direction R. By nesting second thermal stage 322 concentrically within first thermal stage 320, a total cooling power of magneto-caloric thermal diode 300 may be increased relative to non-nested magneto-caloric thermal diodes.

First and second thermal stages 320, 322 may be arranged to provide a flow path for thermal energy along the axial direction A from cold side 202 to hot side 204 of magneto-caloric thermal diode 300 in the manner described above for magneto-caloric thermal diode 200. For example, each of first thermal stages 320 includes magnets 230 and non-magnetic ring 240, and each of second thermal stages 322 includes magnets 230 and non-magnetic ring 240. Magnets 230 and non-magnetic ring 240 may be arranged within first thermal stages 320 in the manner described above for magnets 230 and non-magnetic ring 240 of magneto-caloric thermal diode 200. Magnets 230 and non-magnetic ring 240 may also be arranged within second thermal stages 322 in the manner described above for magnets 230 and non-magnetic ring 240 of magneto-caloric thermal diode 200.

Each non-magnetic ring 240 within first thermal stages 320 may be in conductive thermal contact with a respective non-magnetic ring 240 within second thermal stages 322 along the radial direction R. For example, each non-magnetic ring 240 within first thermal stages 320 may be integral (e.g., at least partially formed from a single piece of material) with the respective non-magnetic ring 240 within second thermal stages 322 along the radial direction R. By placing each non-magnetic ring 240 within first thermal stages 320 in conductive thermal contact with the respective non-magnetic ring 240 within second thermal stages 322, thermal energy flow along the radial direction R between first and second thermal stages 320, 322.

Figure 10:
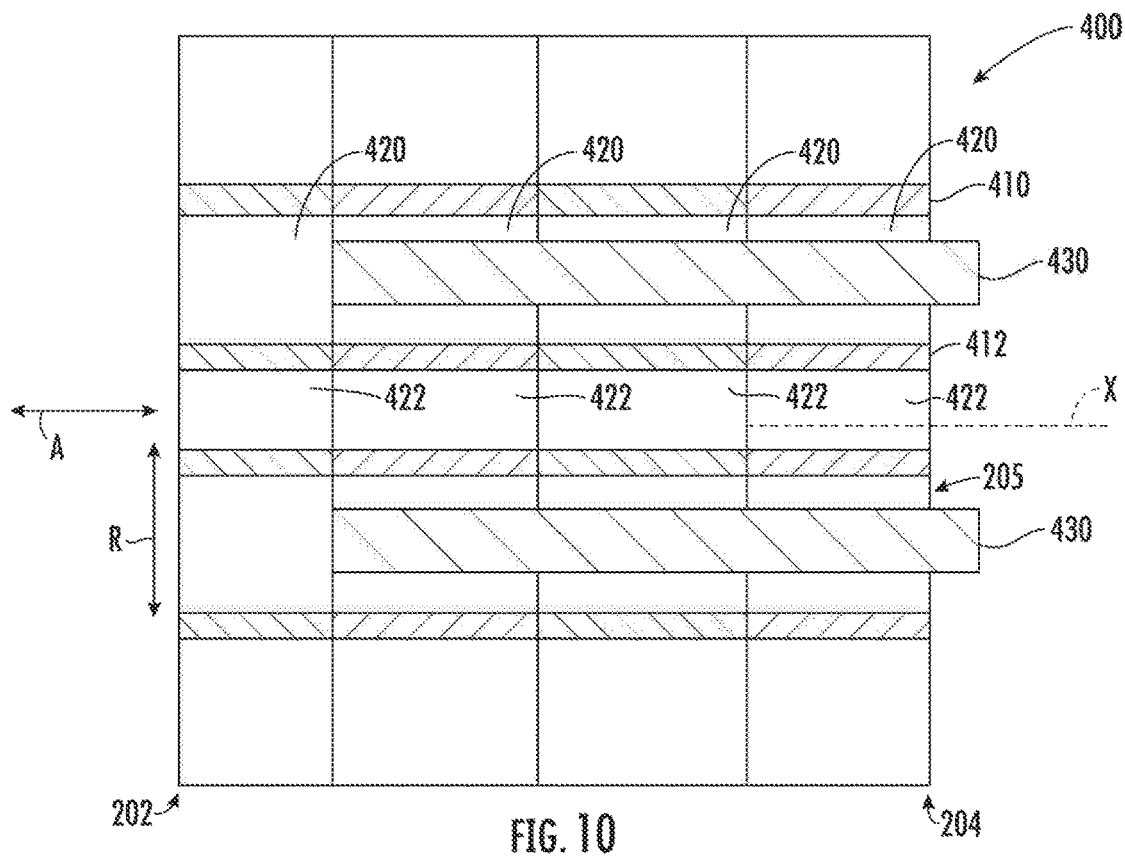
FIG. 10 is a schematic view of the certain components of a magneto-caloric thermal diode according to an additional example embodiment of the present subject matter.

FIG. 10 is a schematic view of the certain components of a magneto-caloric thermal diode 400 according to an additional example embodiment of the present subject matter. As shown in FIG. 10, magneto-caloric thermal diode 400 includes numerous common components with magneto-caloric thermal diodes 200, 300. Thus, the description of magneto-caloric thermal diodes 200, 300 provided above is applicable to magneto-caloric thermal diode 400 except as otherwise noted. In addition, magneto-caloric thermal diodes 200, 300 may include one or more of the aspects of magneto-caloric thermal diode 400 discussed below.

Like magneto-caloric thermal diode 300, magneto-caloric thermal diode 400 includes multiple magneto-caloric cylinders 220 and multiple stacks of thermal stages 210 nested concentrically within each other. In particular, magneto-caloric thermal diode 400 includes a first magneto-caloric cylinder 410 and a second magneto-caloric cylinder 412. Second magneto-caloric cylinder 412 is positioned within first magneto-caloric cylinder 410 along the radial direction R. Magneto-caloric thermal diode 400 also includes a first plurality of thermal stages 420 and a second plurality of thermal stages 422. First thermal stages 420 are stacked along the axial direction A between cold side 202 and hot side 204. Second thermal stages 422 are also stacked along the axial direction A between cold side 202 and hot side 204. First thermal stages 420 are positioned within second thermal stages 422 along the radial direction R. First and second thermal stages 420, 422 and first and second magneto-caloric cylinders 410, 412 are configured for relative rotation between first and second thermal stages 420, 422 and first and second magneto-caloric cylinders 410, 412.

Second magneto-caloric cylinder 412 and second thermal stages 422 are nested concentrically within first magneto-caloric cylinder 410 and first thermal stages 420. In such a manner, magneto-caloric thermal diode 400 may include components for operating as multiple magneto-caloric thermal diodes 200 nested concentrically. First and second magneto-caloric cylinders 410, 412 may have different cascades of magneto-caloric materials along the axial direction A. Thus, e.g., first and second magneto-caloric cylinders 410, 412 may have different magneto-caloric materials along the radial direction R. By nesting second thermal stage 422 concentrically within first thermal stage 420, a total temperature span of magneto-caloric thermal diode 400 relative to non-nested magneto-caloric thermal diodes.

First and second thermal stages 420, 422 may be arranged to provide a flow path for thermal energy along the axial direction A from cold side 202 to hot side 204 of magneto-caloric thermal diode 400 in the manner described above for magneto-caloric thermal diode 200. For example, each of first thermal stages 420 includes magnets 230 and non-magnetic ring 240, and each of second thermal stages 422 includes magnets 230 and non-magnetic ring 240. Magnets 230 and non-magnetic ring 240 may be arranged within first thermal stages 420 in the manner described above for magnets 230 and non-magnetic ring 240 of magneto-caloric thermal diode 200. Magnets 230 and non-magnetic ring 240 may also be arranged within second thermal stages 422 in a similar manner to that described above for magnets 230 and non-magnetic ring 240 of magneto-caloric thermal diode 200 except that the arrangement of second thermal stage 422 may be reversed along the axial direction A.

In addition, the non-magnetic ring 240 in the one of first thermal stages 420 at cold side 202 may be in conductive thermal contact with the non-magnetic ring 240 in the one of second thermal stages 422 at cold side 202 along the radial direction R. For example, the non-magnetic ring 240 in the one of first thermal stages 420 at cold side 202 may be integral (e.g., at least partially formed from a single piece of material) with the one of second thermal stages 422 at cold side 202 along the radial direction R. By placing the non-magnetic ring 240 in the one of first thermal stages 420 at cold side 202 in conductive thermal contact with the one of second thermal stages 422 at cold side 202, thermal energy flow along the radial direction R between first and second thermal stages 420, 422 at cold side 202.

Other than at cold side 202, each non-magnetic ring 240 in first thermal stages 420 may be spaced from a respective non-magnetic ring 240 in second thermal stages 422 along the radial direction R. For example, other than at cold side 202, each non-magnetic ring 240 in first thermal stages 420 may be spaced from the respective non-magnetic ring 240 in second thermal stages 422 along the radial direction R by insulation 430. By spacing each non-magnetic ring 240 in first thermal stages 420 from the respective non-magnetic ring 240 in second thermal stages 422 other than at cold side 202, thermal energy flow along the radial direction R between first and second thermal stages 420, 422 may be limited.

Figure 11:
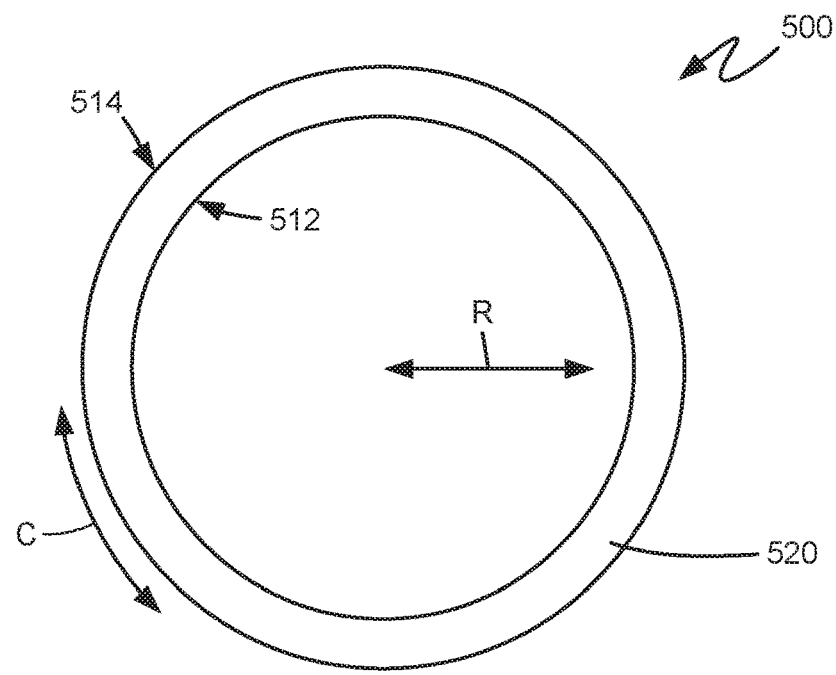
FIG. 11 is an end, elevation view of a magneto-caloric cylinder according to an example embodiment of the present subject matter.
Figure 12:
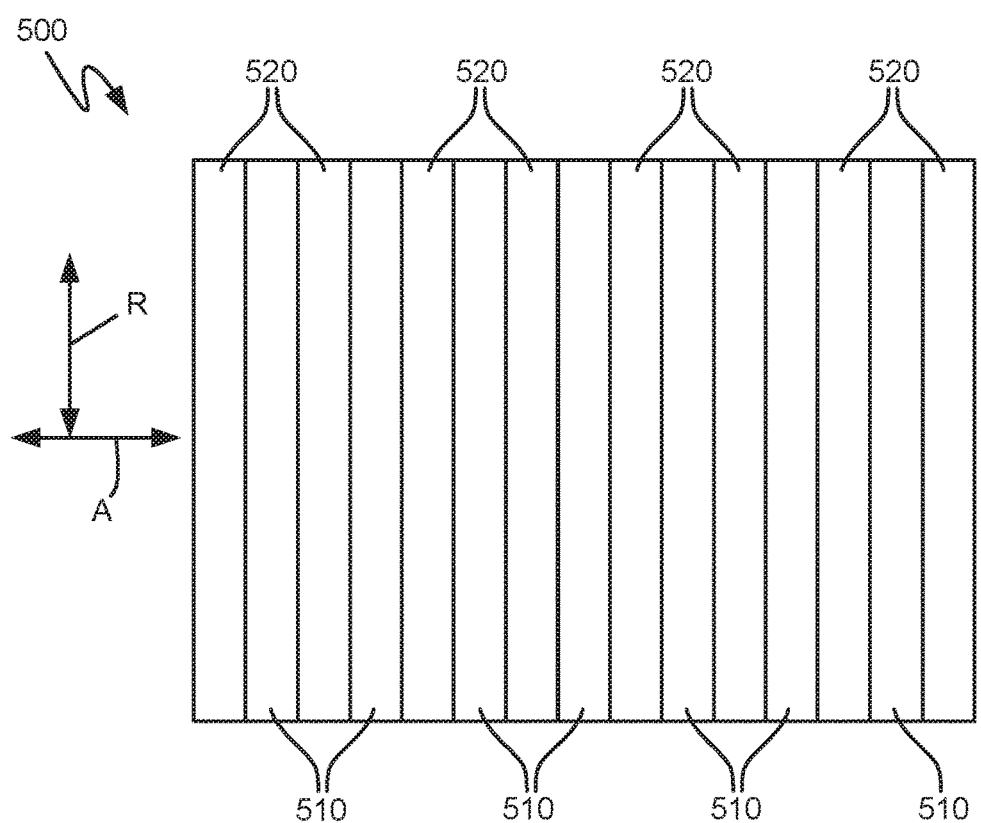
FIG. 12 is a side, elevation view of the example magneto-caloric cylinder of FIG. 11.

FIG. 11 is an end, elevation view of a magneto-caloric cylinder 500 according to an example embodiment of the present subject matter. FIG. 12 is a side, elevation view of magneto-caloric cylinder 500. Magneto-caloric cylinder 500 may be used in any suitable magneto-caloric heat pump. For example, magneto-caloric cylinder 500 may be used in magneto-caloric thermal diode 200 as magneto-caloric cylinder 220. As discussed in greater detail below, magneto-caloric cylinder 500 includes features for anisotropic thermal conductance.

As shown in FIG. 12, magneto-caloric cylinder 500 includes a plurality of magneto-caloric stages 510. Magneto-caloric stages 510 may be annular in certain example embodiments. Each of magneto-caloric stages 510 has a respective Curie temperature. Thus, e.g., each of magneto-caloric stages 510 may have a different magneto-caloric material. In particular, the respective magneto-caloric material within each of magneto-caloric stages 510 may be selected such that the Currie temperature of the magneto-caloric materials changes along the axial direction A. In such a manner, a cascade of magneto-caloric materials may be formed within magneto-caloric cylinder 500 along the axial direction A.

Accordingly, magneto-caloric cylinder 500 can be provided with magneto-caloric stages 510 of different magneto-caloric materials. Each magneto-caloric stage 510 may include a magneto-caloric material that exhibits the magneto-caloric effect at a different temperature or a different temperature range than an adjacent magneto-caloric stage 510 along the axial direction A. By configuring the appropriate number and/or sequence of magneto-caloric stages 510, an associated magneto-caloric thermal diode can be operated over a substantial range of ambient temperatures.

Magneto-caloric cylinder 500 also includes a plurality of insulation blocks 520. Magneto-caloric stages 510 and insulation blocks 520 may be stacked and interspersed with one another along the axial direction A within magneto-caloric cylinder 500. In particular, magneto-caloric stages 510 and insulation blocks 520 may be distributed sequentially along the axial direction A in the order of magneto-caloric stage 510 then insulation block 520 within magneto-caloric cylinder 500. Thus, e.g., each magneto-caloric stage 510 may be positioned between a respective pair of insulation blocks 520 along the axial direction A within magneto-caloric cylinder 500.

Insulation blocks 520 may limit conductive heat transfer along the axial direction A between magneto-caloric stages 510. In particular, insulation blocks 520 may limit conductive heat transfer along the axial direction A between magneto-caloric stages 510 with different Currie temperatures. Insulation blocks 520 may be constructed of a suitable insulator, such as a plastic. Insulation blocks 520 may be annular in certain example embodiments. Thus, e.g., each insulation block 520 may be a plastic ring.

Figure 13:
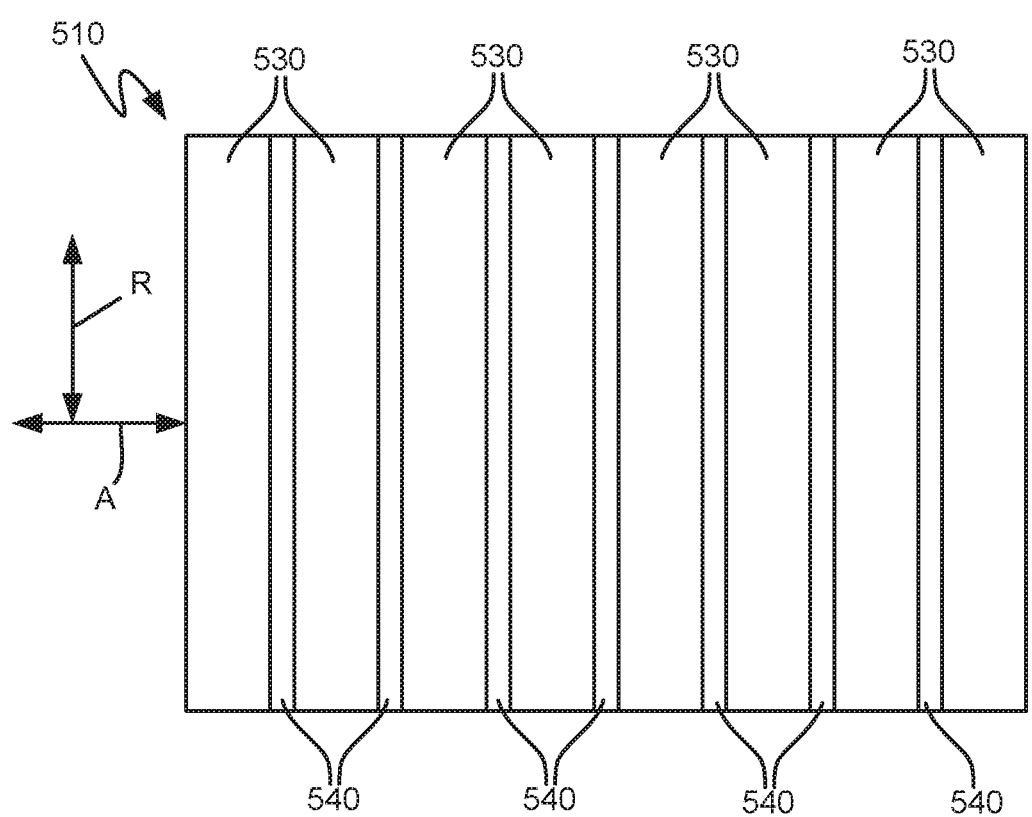
FIG. 13 is a side, elevation view of a magneto-caloric stage of the example magneto-caloric cylinder of FIG. 11.

FIG. 13 is a side, elevation view of one of magneto-caloric stages 510. Although only one of magneto-caloric stages 510 is shown in FIG. 13, the other magneto-caloric stages 510 in magneto-caloric cylinder 500 may be constructed in the same or similar manner to that shown in FIG. 13. As discussed in greater detail below, magneto-caloric stage 510 may be constructed such that conductive heat transfer along the radial direction R is greater than conductive heat transfer along the axial direction A. Thus, magneto-caloric stage 510 may be constructed such that the thermal conductance of magneto-caloric stage 510 is greater along the radial direction R relative to the thermal conductance of magneto-caloric stage 510 along the axial direction A.

In FIG. 13, magneto-caloric stage 510 includes a plurality of magneto-caloric material blocks 530 and a plurality of metal foil layers 540. Magneto-caloric material blocks 530 and metal foil layers 540 are stacked and interspersed with one another along the axial direction A in magneto-caloric stage 510. In particular, magneto-caloric material blocks 530 and metal foil layers 540 may be distributed sequentially along the axial direction A in the order of magneto-caloric material block 530 then metal foil layer 540. Thus, e.g., each metal foil layer 540 may be positioned between a respective pair of magneto-caloric material blocks 530 along the axial direction A within magneto-caloric stage 510.

In each magneto-caloric stage 510, the magneto-caloric material blocks 530 may be constructed of a respective magneto-caloric material that exhibits the magneto-caloric effect. Thus, e.g., the magneto-caloric material blocks 530 within each magneto-caloric stage 510 may have a common magneto-caloric material composition. Conversely, as noted above, each of magneto-caloric stages 510 may have a different magneto-caloric material composition.

Metal foil layers 540 may be provide a heat flow path within magneto-caloric stage 510. In particular, metal foil layers 540 may have a greater thermal conductance than magneto-caloric material blocks 530. Thus, heat may conduct more easily along the radial direction R, e.g., through metal foil layers 540, compared to along the axial direction A, e.g., through magneto-caloric material blocks 530.

As shown in FIG. 13, metal foil layers 540 may be spaced apart from one another along the axial direction A within magneto-caloric stage 510, e.g., by magneto-caloric material blocks 530. Conversely, metal foil layers 540 may extend, e.g., continuously, along the radial direction R from an inner surface 512 of magneto-caloric stage 510 to an outer surface 514 of magneto-caloric stage 510. Inner surface 512 of magneto-caloric stage 510 may be positioned opposite outer surface 514 of magneto-caloric stage 510 along the radial direction R on magneto-caloric stage 510. In particular, inner and outer surfaces 512, 514 of magneto-caloric stage 510 may be cylindrical and may be positioned concentric with each other. With metal foil layers 540 arranged in such a manner, heat may conduct more easily along the radial direction R compared to along the axial direction A within magneto-caloric stage 510.

Metal foil layers 540 may act as a binder between adjacent magneto-caloric material blocks 530. Thus, magneto-caloric stage 510 may have greater mechanical strength than magneto-caloric stages without metal foil layers 540. Metal foil layers 540 may be constructed of a suitable metal. For example, metal foil layers 540 may be aluminum foil layers. The percentage of metal foil layers 540 may also be selected to provide desirable thermal conductance and mechanical binding. For example, a total volume of metal within magneto-caloric stage 510 may be about ten percent (10%), and, e.g., the remainder of the volume of magneto-caloric stage 510 may be magneto caloric material, binder, etc. within magneto-caloric material blocks 530. As used herein the term "about" means within nine percent of the stated percentage when used in the context of volume percentages.

As noted above, the thermal conductance along the radial direction R within magneto-caloric stage 510 may be greater than the thermal conductance along the radial direction A. Thus, an associated thermal diode with magneto-caloric cylinder 500, such as magneto-caloric thermal diode 200, may harvest caloric effect (heat) more quickly compared to thermal diodes with magneto-caloric cylinders lacking metal foil layers. In such a manner, a power density of the associated thermal diode may be increased relative to the thermal diodes with magneto-caloric cylinders lacking metal foil layers.

It will be understood that while described above in the context of magneto-caloric cylinder 500, the present subject matter may also be used to form magneto-caloric regenerators with any other suitable shape in alternative example embodiments. For example, the present subject matter may be used with planar and/or rod-shaped regenerators having anisotropic thermal conductance.

Figure 14:
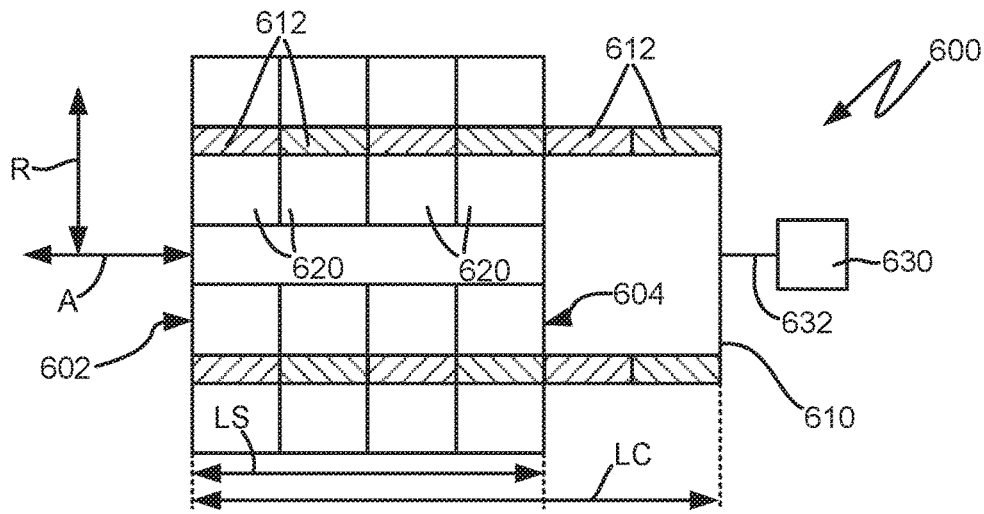
FIGS. 14 through 16 are side, elevation view of a magneto-caloric thermal diode according to another example embodiment of the present subject matter and with a magneto-caloric cylinder shown in various positions.
Figure 15:
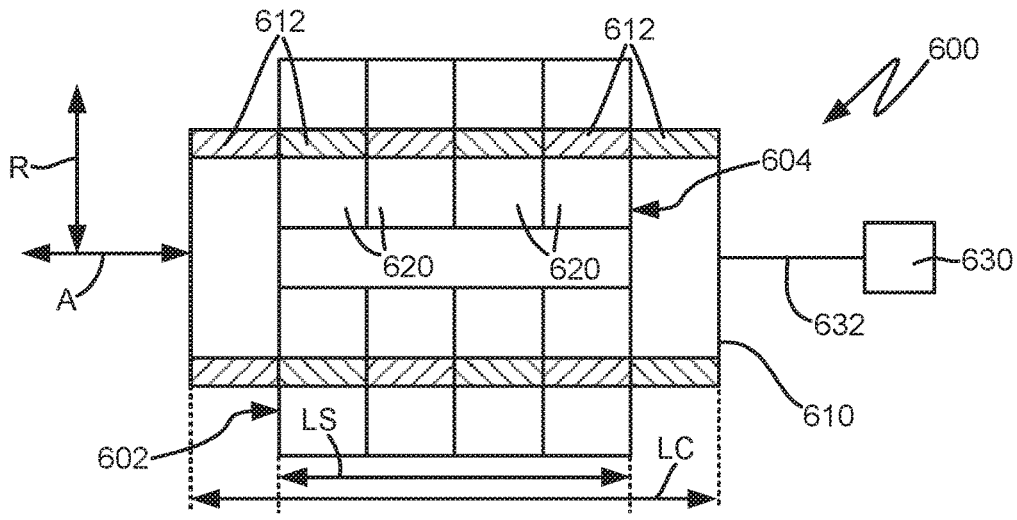
Figure 16:
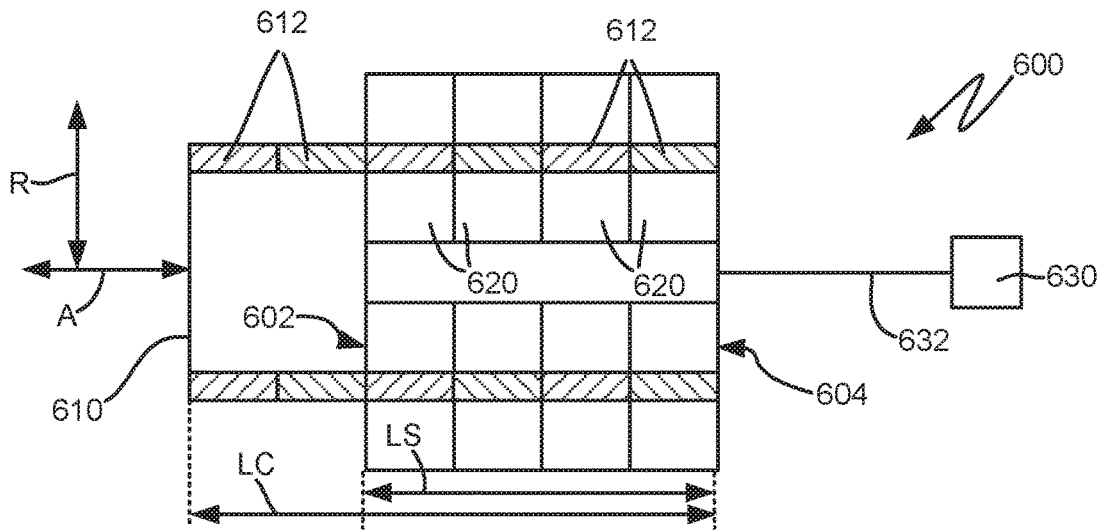

FIGS. 14 through 16 are side, elevation view of a magneto-caloric thermal diode 600 according to another example embodiment of the present subject matter. Magneto-caloric thermal diode 600 includes similar or the same components as magneto-caloric thermal diode 200. Thus, the description of magneto-caloric thermal diodes 200 provided above is applicable to magneto-caloric thermal diode 600 except as otherwise noted. For example, magneto-caloric thermal diode 600 includes a magneto-caloric cylinder 610 and a stack of thermal stages 620 that are rotatable relative to each other. As discussed in greater detail below, magneto-caloric thermal diode 600 includes features for efficiently operating over a variety of temperatures.

In FIGS. 14 through 16, magneto-caloric cylinder 610 is shown in various positions along the axial direction A relative to thermal stages 620. Magneto-caloric cylinder 610 includes a plurality of magneto-caloric stages 612. Magneto-caloric stages 612 may be annular in certain example embodiments. Each of magneto-caloric stages 612 has a respective Curie temperature. Thus, e.g., each of magneto-caloric stages 612 may have a different magneto-caloric material. In particular, the respective magneto-caloric material within each of magneto-caloric stages 612 may be selected such that the Currie temperature of the magneto-caloric materials changes along the axial direction A. In such a manner, a cascade of magneto-caloric materials may be formed within magneto-caloric cylinder 610 along the axial direction A.

Accordingly, magneto-caloric cylinder 610 can be provided with magneto-caloric stages 612 of different magneto-caloric materials. Each magneto-caloric stage 612 may include a magneto-caloric material that exhibits the magneto-caloric effect at a different temperature or a different temperature range than an adjacent magneto-caloric stage 612 along the axial direction A. By configuring the appropriate number and/or sequence of magneto-caloric stages 612, magneto-caloric thermal diode 600 can be operated over a substantial range of ambient temperatures.

Magneto-caloric cylinder 610 has a length LC, e.g., along the axial direction A. Magneto-caloric stages 612 are distributed along the length LC of magneto-caloric cylinder 610. Thermal stages 620 also have a length LS, e.g., along the axial direction A. In particular, the stack of thermal stages 620 may collectively define the length LS. The length LS of thermal stages 620 is less than the length LC of magneto-caloric cylinder 610. Thus, magneto-caloric cylinder 610 may be longer in the axial direction A than the stack of thermal stages 620. In addition, only a portion of the length LC of magneto-caloric cylinder 610 may be positioned within thermal stages 620, and at least a portion of the length LC of magneto-caloric cylinder 610 may be positioned outside of thermal stages 620.

Magneto-caloric cylinder 610 is movable along the axial direction A relative to thermal stages 620. Thus, the portion of the length LC of magneto-caloric cylinder 610 positioned within thermal stages 620 may be adjusted or changed. A linear actuator 630 is coupled to magneto-caloric cylinder 610. Linear actuator 630 is operable to move magneto-caloric cylinder 610 along the axial direction A relative to thermal stages 620. Controller 80 may be configured to operate linear actuator 630 in order to adjust the portion of the length LC of magneto-caloric cylinder 610 positioned within thermal stages 620. Thus, controller 80 may operate linear actuator 630 to change the position of magneto-caloric cylinder 610 along the axial direction A relative to thermal stages 620.

Controller 80 may be configured to operate linear actuator 630 in response to temperature measurements from temperature sensor 82. Temperature sensor 82 may be positioned for measuring the temperature of air within cabinet 12, e.g., one of refrigeration compartments 30, or an ambient temperature about cabinet 12. Utilizing temperature sensor 82, controller 80 may operate linear actuator 630 to adjust the position of magneto-caloric cylinder 610 along the axial direction A relative to thermal stages 620 based on environmental conditions, such as a rejection temperature and/or an absorption temperature.

Linear actuator 630 may be a suitable linear actuator. For example, linear actuator 630 may be a mechanical, electromechanical or another suitable linear actuator with a shaft or piston of linear actuator 630 coupled to magneto-caloric cylinder 610. In certain example embodiments, linear actuator 630 may include a threaded shaft 632 coupled magneto-caloric cylinder 610. By rotating threaded shaft 632 (e.g., with an electric motor of linear actuator 630), the position of magneto-caloric cylinder 610 along the axial direction A relative to thermal stages 620 may be adjusted or changed.

The respective Currie temperature of each of magneto-caloric stages 612 may selected such that a total Currie temperature span of magneto-caloric stages 612 is about eighty degrees Celsius (80° C.) along the length LC of magneto-caloric cylinder 610. As used herein, the term "about" means within ten degrees Celsius (10° C.) of the stated temperature when used in the context of Currie temperatures. The total Currie temperature span of magneto-caloric stages 612 may correspond to the difference between a maximum Currie temperature of magneto-caloric stages 612 and a minimum Currie temperature of magneto-caloric stages 612. The minimum Currie temperature of magneto-caloric stages 612 may be about negative thirty degrees Celsius (−30° C.), and the maximum Currie temperature of magneto-caloric stages 612 may be about thirty-five degrees Celsius (35° C.). Such total Currie temperature span may allow efficient operation of magneto-caloric thermal diode 600 in a variety of disparate ambient conditions. The magneto-caloric stages 612 with the maximum and minimum Currie temperatures may be positioned at opposite ends of magneto-caloric cylinder 610 along the axial direction A.

As noted above, only a portion of the length LC of magneto-caloric cylinder 610 may be positioned within thermal stages 620. Thus, an operating Currie temperature span of magneto-caloric stages 612 may be about fifty degrees Celsius (50° C.). The operating Currie temperature span of magneto-caloric stages 612 is a portion of the total Currie temperature span of magneto-caloric stages 612. In particular, the operating Currie temperature span of magneto-caloric stages 612 may correspond to the difference between the maximum Currie temperature of magneto-caloric stages 612 within thermal stages 620 and the minimum Currie temperature of magneto-caloric stages 612 within thermal stages 620. The operating Currie temperature span of magneto-caloric stages 612 may be selected by adjusting the portion of the length LC of magneto-caloric cylinder 610 within thermal stages 620.

In FIG. 14, the maximum Currie temperature of magneto-caloric stages 612 within thermal stages 620 is about negative thirty-five degrees Celsius (−35° C.), and the minimum Currie temperature of magneto-caloric stages 612 is about fifteen degrees Celsius (15° C.). In FIG. 15, the maximum Currie temperature of magneto-caloric stages 612 within thermal stages 620 is about negative twenty-five degrees Celsius (−25° C.), and the minimum Currie temperature of magneto-caloric stages 612 is about twenty-five degrees Celsius (25° C.). In FIG. 16, the maximum Currie temperature of magneto-caloric stages 612 within thermal stages 620 is about negative fifteen degrees Celsius (−15° C.), and the minimum Currie temperature of magneto-caloric stages 612 is about thirty-five degrees Celsius (35° C.).

By adjusting the position of magneto-caloric cylinder 610 along the axial direction A relative to thermal stages 620, magneto-caloric thermal diode 600 may operate more efficiently over a variety of temperatures relative to fixing the location of magneto-caloric cylinder 610 along the axial direction A relative to thermal stages 620. In particular, the position of magneto-caloric cylinder 610 along the axial direction A relative to thermal stages 620 may be based on environmental conditions, such as rejection temperature and/or absorption temperature. For example, if the rejection temperature is elevated beyond a set point (i.e., a primary design span), the position of magneto-caloric cylinder 610 along the axial direction A relative to thermal stages 620 may be moved along the axial direction A towards a cold side 602. Thus, different magneto-caloric stages 612 may be positioned within thermal stages 620, and operation of magneto-caloric thermal diode 600 may continue despite the difference between the rejection temperature and the set point. With the different magneto-caloric stages 612 positioned within thermal stages 620, the coldest thermal stages 620 working in the magneto-caloric thermal diode 600 will then be warmer than as previously operating. The opposite effect may be generated by moving the position of magneto-caloric cylinder 610 along the axial direction A relative to thermal stages 620 along the axial direction A towards a hot side 604. As may be seen from the above, magneto-caloric thermal diode 600 may be operated warmer than the primary design span, colder than the primary design span, or both warmer and colder than the primary design span by moving magneto-caloric cylinder 610 along the axial direction A relative to thermal stages 620.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A magneto-caloric thermal diode assembly, comprising:
    a magneto-caloric cylinder comprising a plurality of magneto-caloric stages, each of the plurality of magneto-caloric stages having a respective Currie temperature, the magneto-caloric cylinder having a length along an axial direction, the plurality of magneto-caloric stages distributed along the length of the magneto-caloric cylinder; and
    a plurality of thermal stages stacked along the axial direction between a cold side and a hot side, each of the plurality of thermal stages comprises a plurality of magnets and a non-magnetic ring, the plurality of magnets distributed along a circumferential direction within the non-magnetic ring in each of the plurality of thermal stages, the plurality of thermal stages having a length along the axial direction, the length of the plurality of thermal stages being less than the length of the magneto-caloric cylinder;
    wherein the plurality of thermal stages and the magneto-caloric cylinder are configured for relative rotation between the plurality of thermal stages and the magneto-caloric cylinder, and
    wherein the magneto-caloric cylinder is received within the plurality of thermal stages such that the magneto-caloric cylinder is movable along the axial direction relative to the plurality of thermal stages.

2. The magneto-caloric thermal diode assembly of claim 1, wherein:
    a cold side thermal stage of the plurality of thermal stages is positioned at the cold side;
    a hot side thermal stage of the plurality of thermal stages is positioned at the hot side;
    each of the plurality of thermal stages between the cold side thermal stage and the hot side thermal stage is positioned between a respective pair of the plurality of thermal stages along the axial direction;
    one of the respective pair of the plurality of thermal stages is positioned closer to the cold side along the axial direction;
    the other of the respective pair of the plurality of thermal stages is positioned closer to the hot side along the axial direction;
    the plurality of magnets of each of the plurality of thermal stages between the cold side thermal stage and the hot side thermal stage is spaced from the non-magnetic ring of the one of the respective pair of the plurality of thermal stages along the axial direction; and
    the plurality of magnets of each of the plurality of thermal stages between the cold side thermal stage and the hot side thermal stage is in conductive thermal contact with the non-magnetic ring of the other of the respective pair of the plurality of thermal stages.

3. The magneto-caloric thermal diode assembly of claim 2, wherein the plurality of magnets of each of the plurality of thermal stages between the cold side thermal stage and the hot side thermal stage is spaced from the non-magnetic ring of the one of the respective pair of the plurality of thermal stages along the axial direction by insulation.

4. The magneto-caloric thermal diode assembly of claim 1, further comprising a heat exchanger positioned at the cold side.

5. The magneto-caloric thermal diode assembly of claim 1, wherein the plurality of magnets is spaced from the non-magnetic ring along the radial direction and the circumferential direction within each of the plurality of thermal stages.

6. The magneto-caloric thermal diode assembly of claim 5, wherein each of the plurality of thermal stages further comprises insulation positioned between the plurality of magnets and the non-magnetic ring along the radial direction and the circumferential direction.

7. The magneto-caloric thermal diode assembly of claim 1, wherein the non-magnetic ring is an aluminum ring.

8. The magneto-caloric thermal diode assembly of claim 1, wherein the plurality of magnets are uniformly spaced apart along the circumferential direction within the non-magnetic ring in each of the plurality of thermal stages.

9. The magneto-caloric thermal diode assembly of claim 8, wherein each of the plurality of thermal stages comprises no less than ten magnets.

10. The magneto-caloric thermal diode assembly of claim 1, wherein the plurality of thermal stages and the magneto-caloric cylinder are configured for relative rotation about an axis that is parallel to the axial direction.

11. The magneto-caloric thermal diode assembly of claim 1, wherein the plurality of magnets and the non-magnetic ring of each of the plurality of thermal stages collectively define a cylindrical slot, the magneto-caloric cylinder positioned within the cylindrical slot.

12. The magneto-caloric thermal diode assembly of claim 11, wherein the cylindrical slot has a width along a radial direction, the magneto-caloric cylinder having a thickness along the radial direction within the cylindrical slot, the width of the cylindrical slot being about one hundredth of an inch greater than the thickness of the magneto-caloric cylinder.

13. The magneto-caloric thermal diode assembly of claim 1, wherein plurality of thermal stages comprises no less than eight thermal stages.

14. The magneto-caloric thermal diode assembly of claim 1, wherein:
    a cold side thermal stage of the plurality of thermal stages is positioned at the cold side;
    a hot side thermal stage of the plurality of thermal stages is positioned at the hot side; and
    the length of the hot side thermal stage is less than the length of the cold side thermal stage.

15. The magneto-caloric thermal diode assembly of claim 1, wherein the respective Currie temperature of each of the plurality of magneto-caloric stages is selected such that a total Currie temperature span of the plurality of magnetocaloric stages is about eighty degrees Celsius along the length of the magneto-caloric cylinder.

16. The magneto-caloric thermal diode assembly of claim 15, wherein only a portion of the magneto-caloric cylinder is received within the plurality of thermal stages such that an operating Currie temperature span of the plurality of magneto-caloric stages is about fifty degrees Celsius.

17. The magneto-caloric thermal diode assembly of claim 1, wherein a minimum Currie temperature of the plurality of magneto-caloric stages is about negative thirty degrees Celsius, and a maximum Currie temperature of the plurality of magneto-caloric stages is about thirty-five degrees Celsius.

18. The magneto-caloric thermal diode assembly of claim 1, further comprising a controller in operative communication with a linear actuator and a temperature sensor, the linear actuator coupled to the magneto-caloric cylinder, the linear actuator operable to move the magneto-caloric cylinder along the axial direction relative to the plurality of thermal stages, the controller configured to operate the linear actuator in response to a temperature measurement from the temperature sensor.

19. A magneto-caloric thermal diode assembly, comprising:
   a magneto-caloric cylinder comprising a plurality of magneto-caloric stages, each of the plurality of magneto-caloric stages having a respective Currie temperature, the magneto-caloric cylinder having a length along an axial direction, the plurality of magneto-caloric stages distributed along the length of the magneto-caloric cylinder; and
   a plurality of thermal stages stacked along the axial direction between a cold side and a hot side, each of the plurality of thermal stages comprises a plurality of non-magnetic blocks and a magnetic ring, the plurality of non-magnetic blocks distributed along a circumferential direction within the magnetic ring in each of the plurality of thermal stages, the plurality of thermal stages having a length along the axial direction, the length of the plurality of thermal stages being less than the length of the magneto-caloric cylinder,
   wherein the plurality of thermal stages and the magneto-caloric cylinder are configured for relative rotation between the plurality of thermal stages and the magneto-caloric cylinder, and
   wherein the magneto-caloric cylinder is received within the plurality of thermal stages such that the magneto-caloric cylinder is movable along the axial direction relative to the plurality of thermal stages.

* * * * *